United States Patent
Jin et al.

(10) Patent No.: US 11,723,162 B2
(45) Date of Patent: Aug. 8, 2023

(54) DISPLAY DEVICE

(71) Applicant: Samsung Display Co., Ltd., Yongin-si (KR)

(72) Inventors: Jin Byoung Jin, Yongin-si (KR); Jingyu Sim, Suwon-si (KR); Cheuljin Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/552,319

(22) Filed: Dec. 15, 2021

(65) Prior Publication Data

US 2022/0312606 A1  Sep. 29, 2022

(30) Foreign Application Priority Data

Mar. 26, 2021  (KR) .................. 10-2021-0039975

(51) Int. Cl.
  *H05K 5/02* (2006.01)
  *H05K 5/00* (2006.01)
  *H10K 77/10* (2023.01)
  *H10K 102/00* (2023.01)

(52) U.S. Cl.
  CPC ......... *H05K 5/0217* (2013.01); *H05K 5/0017* (2013.01); *H10K 77/111* (2023.02); *H10K 2102/311* (2023.02)

(58) Field of Classification Search
  USPC ........................................ 361/807, 809, 810
  See application file for complete search history.

(56) References Cited

U.S. PATENT DOCUMENTS

| | | | |
|---|---|---|---|
| 9,098,241 B1 | 8/2015 | Cho et al. | |
| 10,299,391 B2 | 5/2019 | Kim et al. | |
| 10,750,625 B2 | 8/2020 | Park | |
| 2016/0363803 A1* | 12/2016 | Kim | G02F 1/133308 |
| 2016/0363960 A1* | 12/2016 | Park | G09F 15/0062 |
| 2017/0318689 A1* | 11/2017 | Kim | H05K 1/028 |
| 2020/0077194 A1* | 3/2020 | Kim | H04R 9/045 |

FOREIGN PATENT DOCUMENTS

| | | |
|---|---|---|
| KR | 10-1773443 | 9/2017 |
| KR | 10-2017-0123854 | 11/2017 |
| KR | 10-2020-0036409 | 4/2020 |

* cited by examiner

*Primary Examiner* — Hung S. Bui
(74) *Attorney, Agent, or Firm* — H.C. Park & Associates, PLC

(57) ABSTRACT

A display device includes a display module, a roller connected to a first end of the display module, a flexible circuit board connected to a second end of the display module, a printed circuit board facing a back surface of the display module and connected to the flexible circuit board, a first holder disposed between the printed circuit board and the display module, a second holder configured to accommodate the printed circuit board and the flexible circuit board, and a connection part protruding from the first holder toward the printed circuit board and connected to the printed circuit board.

19 Claims, 24 Drawing Sheets

DISPLAY DEVICE

CROSS-REFERENCE TO RELATED APPLICATION

This application claims priority from and the benefit of Korean Patent Application No. 10-2021-0039975, filed on Mar. 26, 2021, which is hereby incorporated by reference for all purposes as if fully set forth herein.

BACKGROUND

Field

Embodiments of the invention relate generally to a display device.

Discussion of the Background

Electronic devices such as smart phones, digital cameras, notebook computers, navigation systems, and smart televisions that provide images to a user include a display device for displaying images. The display device generates images and provides the generated images to a user through a display screen.

With the recent development of display device technology, various types of display devices have been developed. For example, various flexible display devices that can be transformed, folded or rolled into a curved shape are being developed. The flexible display devices are easy to carry and can improve user convenience.

Flexible display panels that are used in flexible display devices may also be transformed into various shapes. For example, a display panel may be connected to a roller and wound around or unwound from the roller. When the display panel is wound and unwound, a structure for accommodating a driving part connected to the display panel is required.

The above information disclosed in this Background section is only for understanding of the background of the inventive concepts, and, therefore, it may contain information that does not constitute prior art.

SUMMARY

Devices constructed according to embodiments of the invention are directed to a flexible display device, as well as a driving part for a display module capable of accommodating a flexible display device.

The present disclosure provides a display device including a handle capable of accommodating a flexible circuit board connected to a display module and a printed circuit board.

Additional features of the inventive concepts will be set forth in the description that follows, and in part will be apparent from the description, or may be learned by practice of the inventive concepts.

An embodiment provides a display device that may include a display module, a roller connected to one end of the display module, a flexible circuit board connected to the other end of the display module, a printed circuit board facing the back surface of the display module and connected to the flexible circuit board, a first holder disposed between the printed circuit board and the display module, a second holder configured to accommodate the printed circuit board and the flexible circuit board, and a connection part protruding from the first holder toward the printed circuit board and connected to the printed circuit board.

In an embodiment, a device may include a display module, a roller connected to a first end of the display module, a flexible circuit board connected to a second end of the display module, a printed circuit board facing a back surface of the display module, and connected to the flexible circuit board, a first holder disposed between the printed circuit board and the display module and defining a recessed portion in which the printed circuit board is disposed, and a second holder configured to accommodate the first holder, the printed circuit board, and the flexible circuit board, wherein the printed circuit board may be spaced apart from the first surface of the first holder defining the recessed portion.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
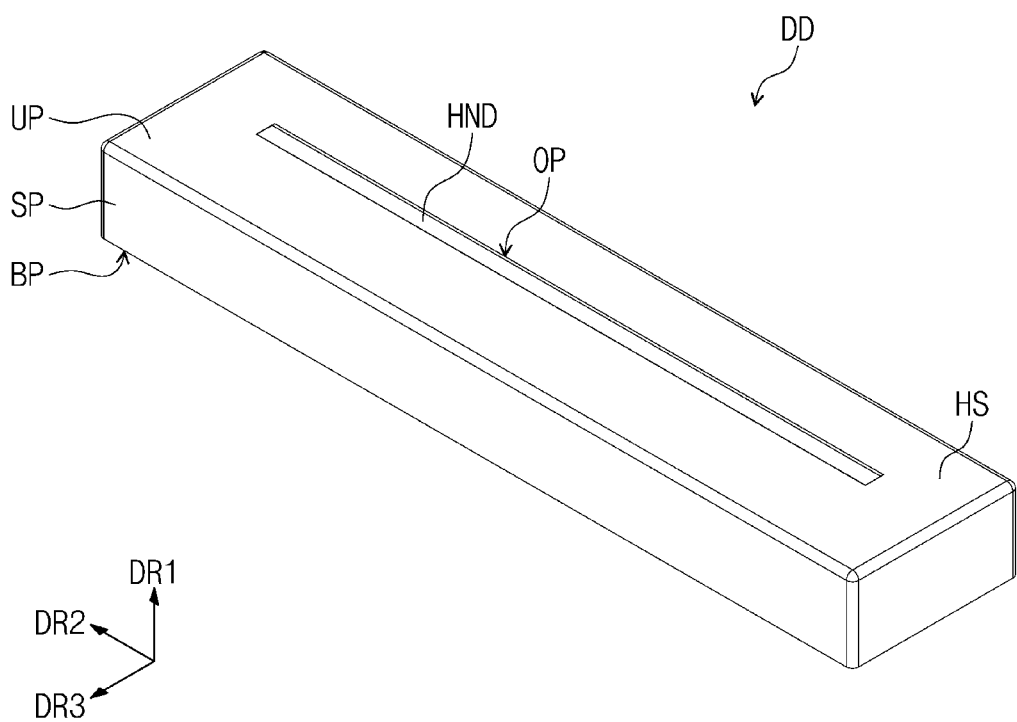
FIG. 1 is a perspective view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the accompanying drawings.

Figure 2:
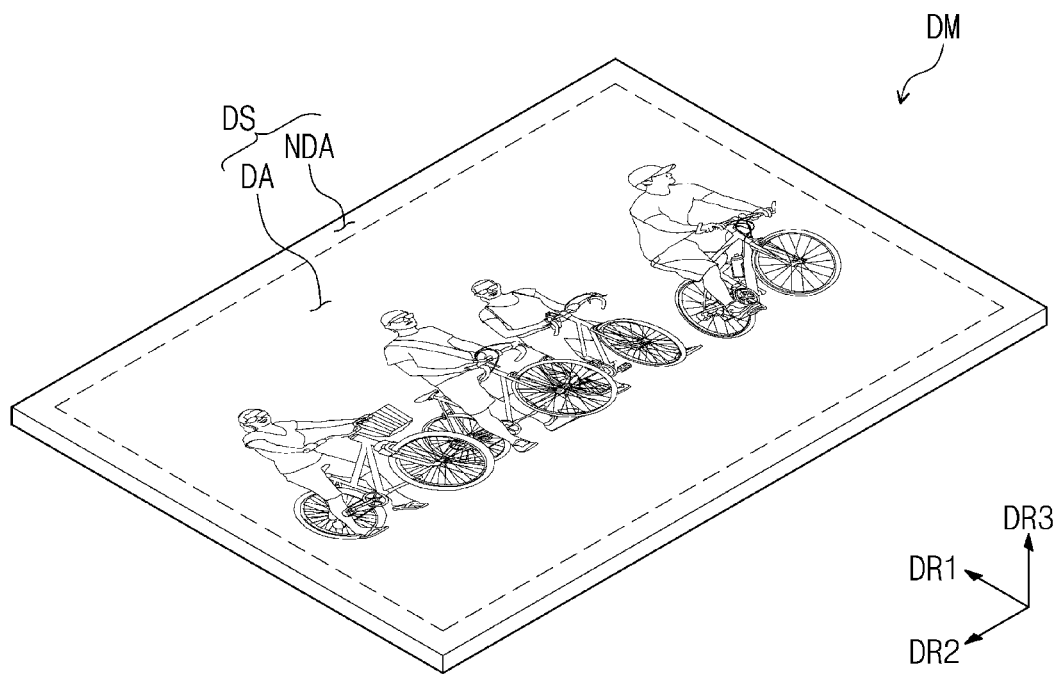
FIG. 2 illustrates a display module which is accommodated in a housing illustrated in FIG. 1.
Figure 3:
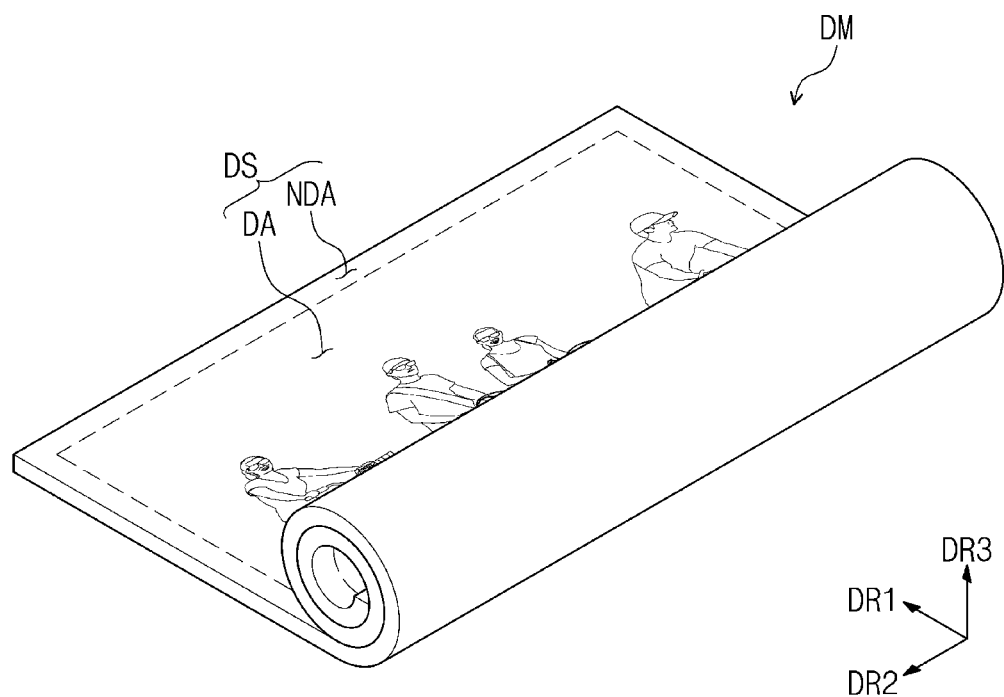
FIG. 3 illustrates a state in which the display module illustrated in FIG. 2 is rolled.

FIG. 1 is a perspective view of a display device according to an embodiment that is constructed according to principles of the invention. FIG. 2 illustrates a display module that is accommodated in a housing illustrated in FIG. 1. FIG. 3 illustrates a state in which the display module illustrated in FIG. 1 is rolled.

Referring to FIGS. 1 and 2, the display device DD may include a housing HS, a handle HND, and a display module DM.

The housing HS may have an opening OP opened toward a first direction DR1 the opening OP being defined therein. The housing HS may extend longer in a second direction DR2 crossing the first direction DR1 than in the first direction DR1. Hereinafter, a direction crossing a plane defined by the first and second directions DR1 and DR2 is defined as a third direction DR3.

The handle HND may be disposed in the opening OP. The handle HND may move away from or move close to the housing HS in the first direction DR1.

The housing HS may include a bottom portion BP, a top portion UP, and sidewall portions SP. The top portion UP may have an opening OP defined therein. The bottom portion BP and the top portion UP may have a plane defined by the second and third directions DR2 and DR3. The bottom portion BP and the top portion UP may face each other in the first direction DR1. The sidewall portions SP may extend from the edge of the bottom portion BP to the edge of the top portion UP.

The display module DM may be accommodated in the housing HS. The display module DM may have a plane defined by the first and second directions DR1 and DR2. The display module DM may have a rectangular shape having short sides extending in the first direction DR1 and long sides extending in the second direction DR2. However, the embodiment described herein is not limited thereto, and the display module DM may have various shapes such as a circle or a polygon.

The upper surface of the display module DM may be defined as a display surface DS and may have a plane defined by the first direction DR1 and the second direction DR2. An image generated by the display module DM may be provided to a user through the display surface DS.

The display surface DS may include a display region DA and a non-display region NDA around the display region DA. The display region DA may display an image, and the non-display region NDA may not display an image. The non-display region NDA surrounds the display region DA and may define a boundary of the display module DM printed in a predetermined color (e.g., black).

Function buttons may be disposed on the housing. The function buttons may provide various functions to the display device DD. For example, the display module DM may be moved to the outside of the housing HS or the inside of the housing HS by operating the function buttons. In addition, the brightness and clarity of an image displayed on the display module DM may be controlled by operating the function buttons.

Referring to FIG. 3, the display module DM may be a flexible display module. The display module DM may be rolled like a scroll. The display module DM may be rolled in the first direction DR1. The display module DM may be rolled from one side of the display module DM. The display module DM may be rolled so that the display surface DS faces inward.

Figure 4:
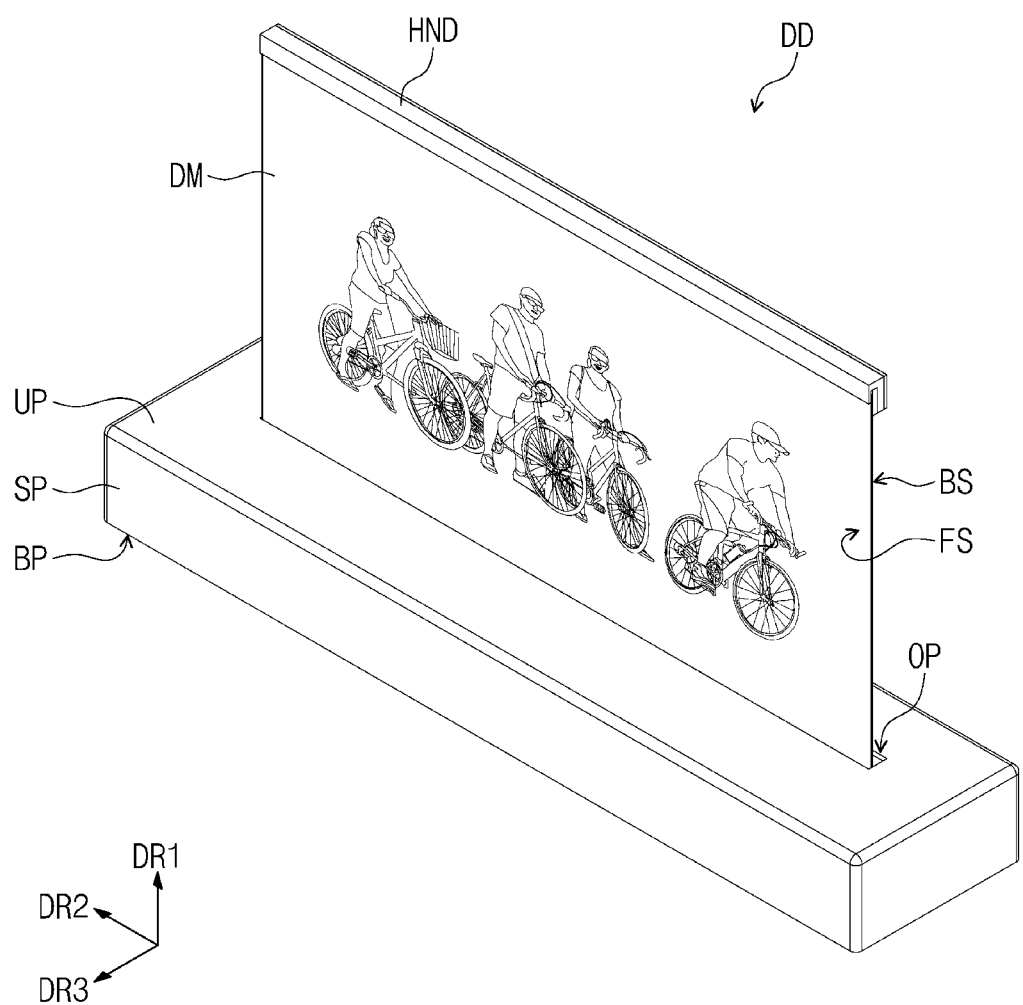
FIG. 4 illustrates the display module exposed to the outside of the housing illustrated in FIG. 1.

FIG. 4 illustrates the display module exposed to the outside of the housing HS illustrated in FIG. 1.

Referring to FIG. 4, based on the first direction DR1, the upper end of the display module DM may be connected to the handle HND. By moving the handle HND away from the housing HS in the first direction DR1, the display module DM may be drawn out of the housing HS through the opening OP.

The display module DM may be extended to the outside of the housing HS by the handle HND so as to be exposed to the outside of the housing HS. A front surface FS of the display module DM may be exposed to the outside of the housing HS. The front surface FS may be the above-described display surface DS. The opposite surface of the front surface FS of the display module DM may be defined as a back surface BS of the display module DM. The front surface FS and the rear surface BS of the display module DM may be the surfaces of the display module DM opposite to each other in the third direction DR3.

When the handle HND moves in the first direction DR1 to be moved closer to the housing HS, as illustrated in FIG. 1, the display module DM may be inserted into the housing HS through the opening OP. Therefore, the display module DM may be disposed inside the housing HS and may not be exposed to the outside.

Figure 5:
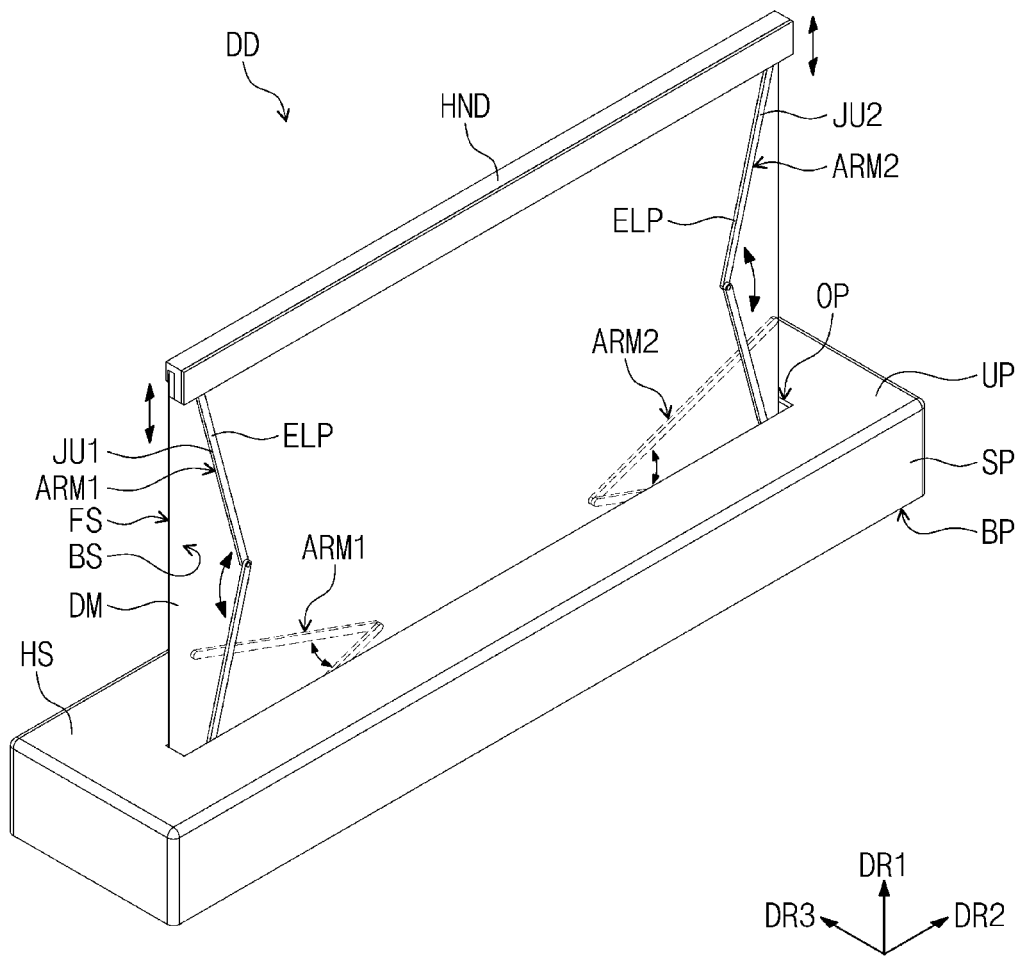
FIG. 5 illustrates an elevating part disposed on the back surface of the display module in FIG. 4.

FIG. 5 illustrates an elevating part disposed on the back surface of the display module in FIG. 4.

Referring to FIG. 5, the display device DD may include an elevating part ELP. The elevating part ELP may be used to extend the display module DM to the outside of the housing HS or reduce the display module DM so as to be inserted into the housing HS.

The elevating part ELP may be disposed on the back surface BS of the display module DM. The elevating part ELP may be accommodated in the housing HS and connected to the handle HND. The elevating part ELP may expand or contract in the first direction DR1 on the back surface BS of the display module DM. The elevating part ELP may move in the first direction DR1 so that the handle HND may move in the first direction DR1.

The elevating part ELP may expand to the outside of the housing HS so that the handle HND may pull the display module DM to the outside of the housing HS. The elevating part ELP may be contracted and inserted into the housing HS so that the handle HND may lead the display module into the housing HS.

The elevating part ELP may include a first arm ARM1 and a second arm ARM2 disposed on the back surface BS of the display module DM. The first arm ARM1 and the second arm ARM2 may be disposed to be spaced apart from each other in the second direction DR2.

One end of the first arm ARM1 and one end of the second arm ARM2 may be connected to the handle HND. The one end of the first arm ARM1 and the one end of the second arm ARM2 may be disposed adjacent to both sides of the handle HND opposite to each other in the second direction DR2.

The other end of the first arm ARM1 and the other end of the second arm ARM2 may be disposed in the housing HS. The first arm ARM1 and the second arm ARM2 may have a foldable bellows structure and expand or contract in the first direction DR1.

When the first and second arms ARM1 and ARM2 contract in the first direction DR1, the handle HND may move to be close to the housing HS in the first direction DR1. In addition, the first and second arms ARM1 and ARM2 may be disposed inside the housing HS.

When the first and second arms ARM1 and ARM2 expand in the first direction DR1, the handle HND may move away from the housing HS in the first direction DR1. In addition, the first and second arms ARM1 and ARM2 may be disposed outside the housing HS.

The first arm ARM1 may include a plurality of first joint units JU1 coupled to each other to rotate. The first joint units JU1 may be coupled in a bellows manner and unfolded or folded in the first direction DR1. As an example, two first joint units JU1 are illustrated, but the number of first joint units JU1 is not limited thereto and may be more than two.

The second arm ARM2 may include a plurality of second joint units JU2 coupled to each other to rotate. The second joint units JU2 may be coupled in a bellows manner and unfolded or folded in the first direction DR1. For example, two second joint units JU2 are illustrated, but the number of second joint units JU2 is not limited thereto, and may be more than two.

Figure 6:
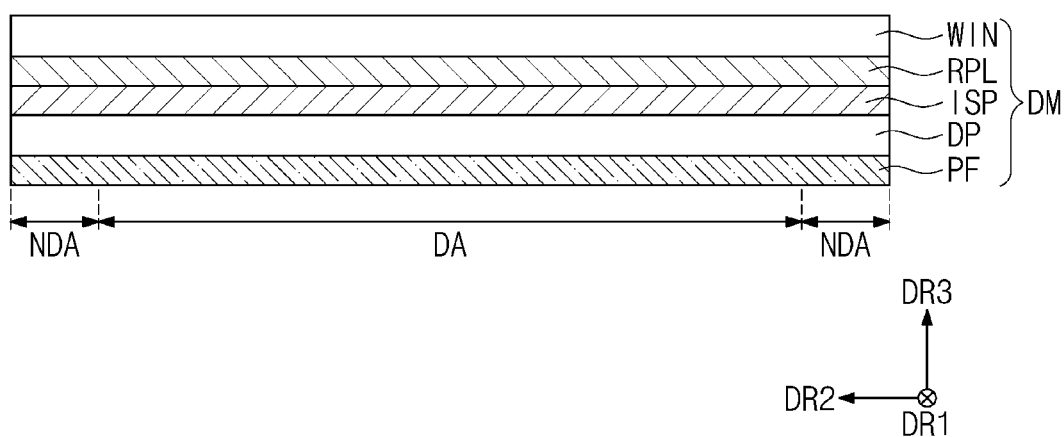
FIG. 6 illustrates, as an example, a cross section of the display module illustrated in FIG. 2.

FIG. 6 illustrates, as an example, a cross section of the display module illustrated in FIG. 2.

For example, FIG. 6 illustrates a cross section of the display module DM viewed from the first direction DR1.

Referring to FIG. 6, the display module DM may include a display panel DP, an input sensing unit ISP, a reflection prevention layer RPL, a window WIN, and a panel protection film PF.

The display panel DP may be a flexible display panel. The display panel DP according to an embodiment may be a light-emitting display panel and is not particularly limited thereto. For example, the display panel DP may be an organic light-emitting display panel or an inorganic light-emitting display panel. The light-emitting layer of the organic light-emitting display panel may contain an organic light-emitting material. The light-emitting layer of the inorganic light-emitting display panel may contain a quantum dot, a quantum rod, and the like. Hereinafter, the display panel DP will be described as an organic light-emitting display panel.

The input sensing unit ISP may be disposed on the display panel DP. The input sensing unit ISP may include a plurality of sensors for sensing an external input in a capacitive method. When the display module DM is manufactured, the input sensing unit ISP may be manufactured directly on the display panel DP. However, the embodiment described herein is not limited thereto, and the input sensing unit ISP may be manufactured as a panel independent of the display panel DP and then attached to the display panel DP by an adhesive layer.

The reflection prevention layer RPL may be disposed on the input sensing unit ISP. The reflection prevention layer RPL may be formed directly on the input sensing unit ISP or may be coupled to the input sensing unit ISP by an adhesive layer. The reflection prevention layer RPL may be defined as an external-light reflection prevention film. The reflection prevention layer RPL may reduce the reflectance of external light incident from above the display device DD toward the display panel DP.

When external light travelling toward the display panel DP is reflected from the display panel DP like a mirror and provided to an external user again, the user may visually recognize the external light. In order to prevent such a phenomenon, as an example, the reflection prevention layer RPL may include a plurality of color filters that display the same colors as those of the pixels of the display panel DP.

The color filters may filter external light so as to display the same colors as those of the pixels. In this case, the external light may not be visually recognized by the user. However, without being limited thereto, the reflection prevention layer RPL may include a polarizing film for reducing the reflectance of the external light. The polarizing film may include a retarder and/or a polarizer.

The window WIN may be disposed on the reflection prevention layer RPL. The window WIN may be formed directly on the reflection prevention layer RPL or bonded to the reflection prevention layer RPL by an adhesive layer. The window WIN may protect the display panel DP, the input sensing unit ISP, and the reflection prevention layer RPL from external scratch and impact.

The panel protection film PF may be disposed below the display panel DP. The panel protection film PF may be formed directly beneath the display panel DP or may be bonded to the display panel DP by an adhesive layer. The panel protection film PF may protect the lower portion of the display panel DP. The panel protection film PF may contain a flexible plastic material such as polyethylene terephthalate (PET).

Figure 7:
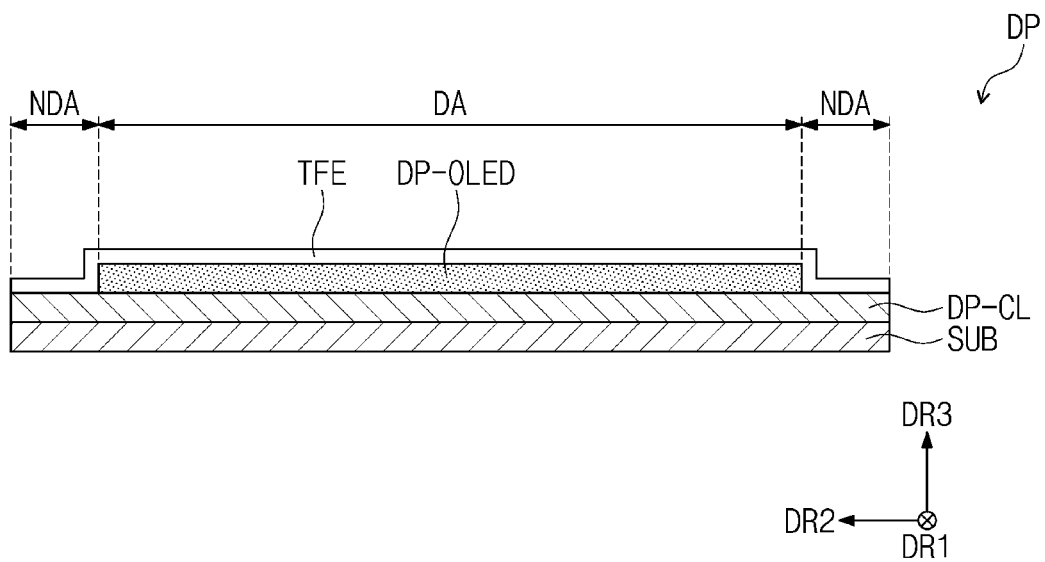
FIG. 7 illustrates, as an example, a cross section of the display panel illustrated in FIG. 6.

FIG. 7 illustrates, as an example, a cross section of the display panel illustrated in FIG. 6.

For example, FIG. 7 illustrates a cross section of the display panel DP viewed from the first direction DR1.

Referring to FIG. 7, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may contain a flexible plastic material such as polyimide (PI). The display element layer DP-OLED may be disposed in the display region DA.

A plurality of pixels may be disposed in the display region DA. Each of the pixels may include a light-emitting element which is connected to a transistor disposed in the circuit element layer DP-CL and disposed in the display element layer DP-OLED.

The thin-film encapsulation layer TFE may be disposed on the circuit element layer DP-CL so as to cover the display element layer DP-OLED. The thin-film encapsulation layer TFE may include inorganic layers and an organic layer interposed between the inorganic layers. The inorganic layers may protect the pixels from moisture/oxygen. The organic layer may protect the pixels from foreign substances such as dust particles.

Figure 8:
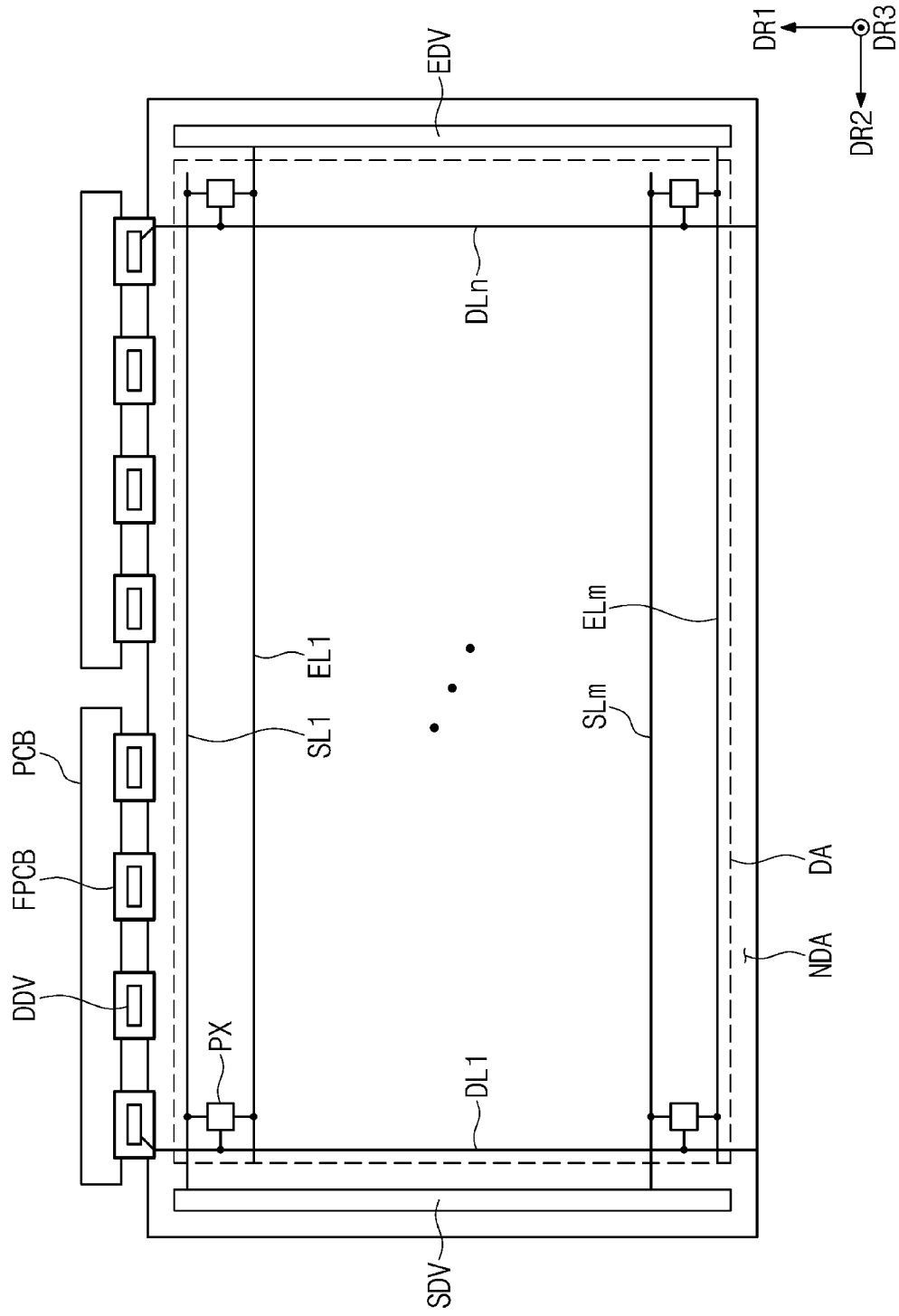
FIG. 8 is a plane view of the display panel illustrated in FIG. 6.

FIG. 8 is a plane view of the display panel illustrated in FIG. 6.

Referring to FIG. 8, the display device DD may include a display panel DP, a scan driver SDV, a plurality of data drivers DDV, a plurality of flexible circuit boards FPCB, a plurality of printed circuit boards PCB, and a light-emitting driver EDV.

The display panel DP may include a display region DA and a non-display region NDA surrounding the display region DA. The display panel DP may have a rectangular shape having long sides extending in the second direction DR2 and short sides extending in the first direction DR1, but the shape of the display panel DP is not limited thereto.

The display panel DP may include a plurality of pixels PX, a plurality of scan lines SL1 to SLm, a plurality of data lines DL1 to DLn, and a plurality of light-emitting lines EL1 to ELm. m and n are natural numbers (i.e., positive integers greater than or equal to one).

The pixels PX may be disposed in the display region DA. The scan driver SDV and the light-emitting driver EDV may be disposed in the non-display region NDA adjacent to short sides of the display panel DP, respectively.

The data drivers DDV may be disposed adjacent to the upper side of the display panel DP defined as one of the long sides of the display panel DP. The printed circuit boards PCB may be disposed adjacent to the upper side of the display panel DP. The flexible circuit boards FPCB may be connected to the upper side of the display panel DP and the printed circuit boards PCB. The data drivers DDV may be manufactured in the form of an integrated circuit chip and mounted on the flexible circuit boards FPCB, respectively.

The scan lines SL1 to SLm may extend in the second direction DR2 to be connected to the pixels PX and the scan driver SDV. The light-emitting lines EL1 to ELm may extend in the second direction DR2 to be connected to the pixels PX and the light-emitting driver EDV.

The data lines DL1 to DLn may extend in the first direction DR1 to be connected to the pixels PX and the data drivers DDV. As an example, two data lines DL1 and DLn connected to the data drivers DDV disposed on the leftmost and rightmost sides are illustrated, but substantially, a plurality of data lines may be connected to each of the data drivers DDV.

The display device DD may further include a timing controller for controlling operations of the scan driver SDV, the data drivers DDV, and the light-emitting driver EDV. The timing controller may be manufactured in the form of an integrated circuit chip and mounted on the printed circuit boards PCB. The timing controller may be connected to the data drivers DDV, the scan driver SDV, and the light-emitting driver EDV through the printed circuit boards PCB and the flexible circuit board FPCB.

The scan driver SDV may generate a plurality of scan signals, and the scan signals may be applied to the pixels PX through the scan lines SL1 to SLm. The data drivers DDV may generate a plurality of data voltages, and the data voltages may be applied to the pixels PX through the data lines DL1 to DLn. The light-emitting driver EDV may generate a plurality of light-emitting signals, and the light-emitting signals may be applied to the pixels PX through the light-emitting lines EL1 to ELm.

The pixels PX may receive data voltages in response to scan signals. The pixels PX may display an image by emitting light having a luminance corresponding to the data voltages in response to the light-emitting signals. The light-emitting time of the pixels PX may be controlled by the light-emitting signals.

Figure 9:
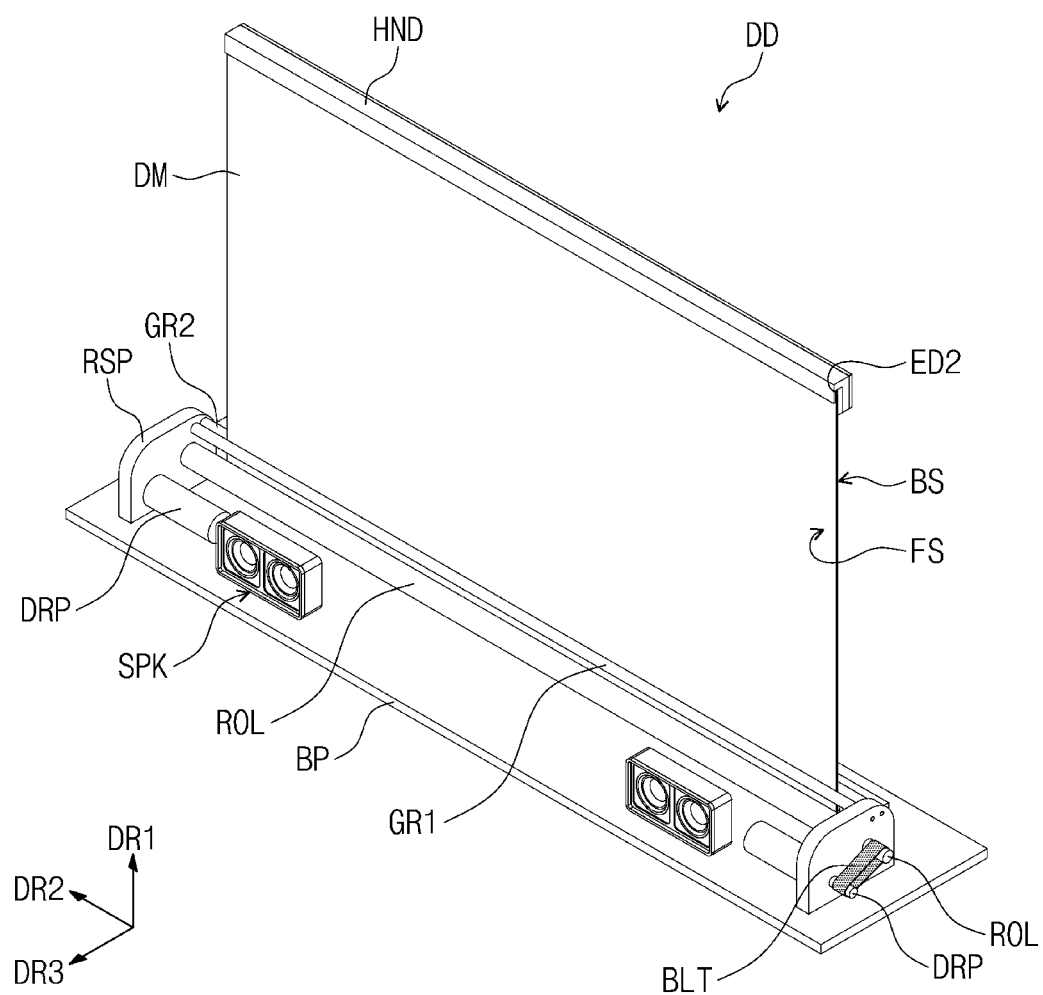
FIG. 9 illustrates the inside of the housing of the display device illustrated in FIG. 4.
Figure 10:
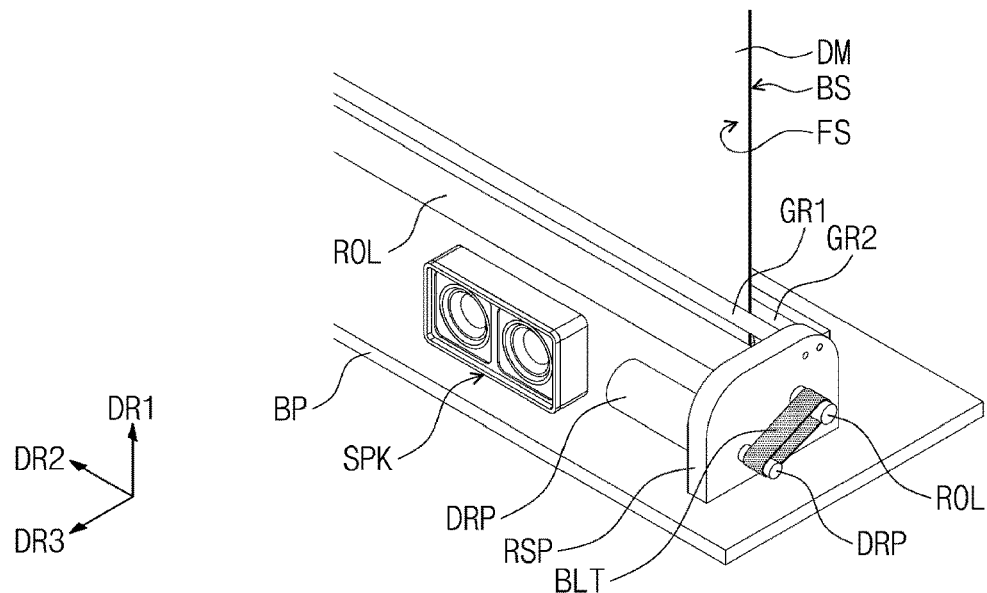
FIG. 10 is an enlarged view of a driving part, a roller, first and second guide rollers, and a speaker illustrated on the right side in FIG. 9.
Figure 11:
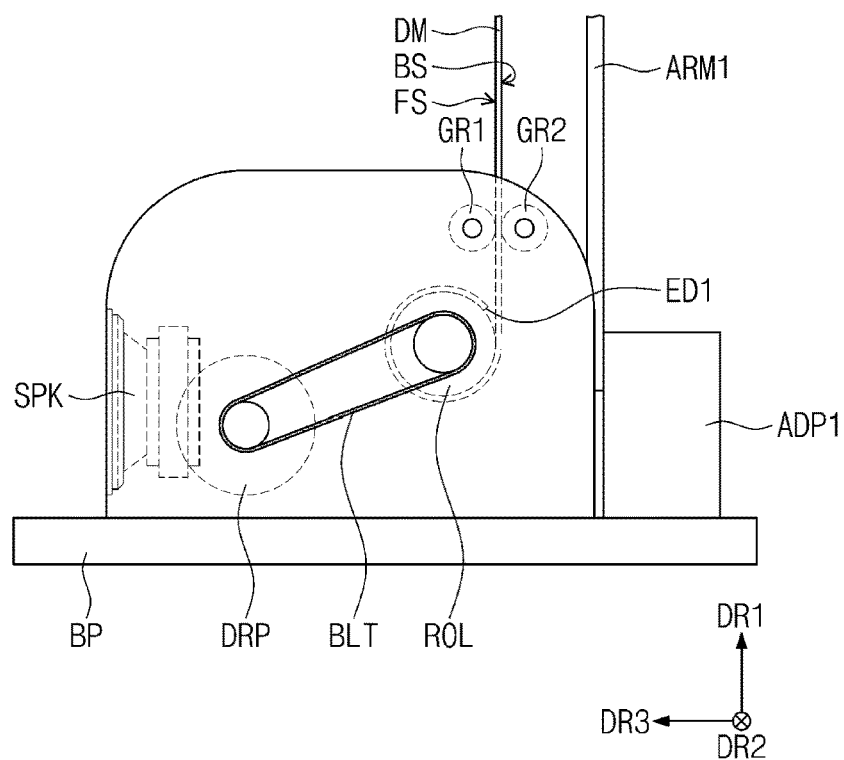
FIG. 11 is a side view of the driving part, the roller, the first and second guide rollers, and the speaker illustrated in FIG. 10.

FIG. 9 illustrates the inside of the housing of the display device illustrated in FIG. 4. FIG. 10 is an enlarged view of a driving part, a roller, first and second guide rollers, and a speaker illustrated on the right side in FIG. 9. FIG. 11 is a side view of the driving part, the roller, the first and second guide rollers, and the speaker illustrated in FIG. 10.

For example, FIG. 9 illustrates the bottom portion BP of the housing HS, and the top portion UP and the sidewall portions SP of the housing HS are omitted.

Referring to FIGS. 4, 9, 10, and 11, the display device DD may include a plurality of driving parts DRP, a roller ROL, first and second guide rollers GR1 and GR2, and a plurality of roller support parts RSP, a belt BLT, and a speaker SPK.

The driving parts DRP, the roller ROL, the first and second guide rollers GR1 and GR2, the roller support parts RSP, the belt BLT, and the speaker SPK may be disposed in the housing HS. The driving parts DRP, the roller ROL, the first and second guide rollers GR1 and GR2, the roller support parts RSP, the belt BLT, and the speaker SPK may be disposed on the bottom portion BP.

The driving parts DRP may have a cylindrical shape extending in the second direction DR2. The driving parts DRP may be spaced apart from each other in the second direction DR2 to face each other. The driving parts DRP may be defined as motors. The driving parts DRP may rotate about a rotation axis parallel to the second direction DR2. The driving parts DRP may rotate clockwise or counterclockwise.

The roller ROL may have a cylindrical shape extending in the second direction DR2. The roller ROL may rotate about a rotation axis RX1 parallel to the second direction DR2. The roller ROL may rotate clockwise or counterclockwise.

One end ED1 of the display module DM among both ends of the display module DM opposite to each other in the first direction DR1 may be connected to the roller ROL. The other end ED2 of the display module DM among both ends of the display module DM opposite to each other in the first direction DR1 may be connected to the handle HND. The display module DM may be wound around the roller ROL or may be unwound from the roller ROL.

The driving parts DRP may be spaced apart from the roller ROL in the third direction DR3 and disposed closer to the bottom portion BP than the roller ROL. The driving parts DRP may be disposed to be spaced further apart from the display module DM than the roller ROL.

The first and second guide rollers GR1 and GR2 may have a cylindrical shape extending in the second direction DR2. The first and second guide rollers GR1 and GR2 may be disposed above the roller ROL on the basis of the first direction DR1. The first and second guide rollers GR1 and GR2 may rotate about a rotation axis parallel to the second direction DR2. The first and second guide rollers GR1 and GR2 may rotate clockwise or counterclockwise.

The display module DM rolled by the roller ROL may pass between the first guide roller GR1 and the second guide roller GR2 and extend in the first direction DR1. The first guide roller GR1 and the second guide roller GR2 may guide the movement of the display module DM.

The roller support parts RSP may be spaced apart from each other in the second direction DR2 to face each other. The roller support parts RSP may be disposed outside both sides of the display module DM opposite to each other in the second direction DR2. In the housing HS, the display module DM may be disposed between the roller support parts RSP.

The driving parts DRP may be disposed between and connected to the roller support parts RSP. One side of the driving parts DRP may pass through the roller support parts RSP and protrude out of the roller support parts RSP. The outside of the roller support parts RSP may be defined as the outside of the other surfaces of the roller support parts RSP opposite to one surfaces of the roller support parts RSP facing each other.

The roller ROL and the first and second guide rollers GR1 and GR2 may be disposed between and connected to the roller support parts RSP. Both sides of the roller ROL opposite to each other in the second direction DR2 and both sides of the first and second guide rollers GR1 and GR2 opposite to each other in the second direction DR2 may pass through the roller support parts RSP and protrude to the outside of the roller support parts RSP.

The belt BLT may have a closed-loop shape and connect the driving parts DRP and the roller ROL. The belt BLT may surround the driving parts DRP and the roller ROL in a closed-loop shape outside the roller support parts RSP. The belt BLT may be defined as a timing belt that transmits power. The rotational force of the driving parts DRP may be transmitted to the roller ROL through the belt BLT.

When the driving parts DRP rotate clockwise, the rotational force of the driving parts DRP is transmitted to the roller ROL through the belt BLT so that the roller ROL may rotate clockwise. The roller ROL rotates clockwise so that the display module DM may be wound around the roller ROL.

When the display module DM is wound around the roller ROL, the first guide roller GR1 rotates clockwise and the second guide roller GR2 rotates counterclockwise so that the display module DM may pass between the first guide roller GR1 and the second guide roller GR2.

When the driving parts DRP rotate counterclockwise, the rotational force of the driving parts DRP is transmitted to the roller ROL through the belt BLT so that the roller ROL may rotate counterclockwise. Since the roller ROL rotates counterclockwise, the display module DM may be unwound from the roller ROL.

When the display module DM is unwound from the roller ROL, the first guide roller GR1 rotates counterclockwise and the second guide roller GR2 rotates clockwise so that the display module DM may pass between the first guide roller GR1 and the second guide roller GR2.

The speakers SPK may be disposed between the driving parts DRP. The speakers SPK may be acoustic elements that generate sound.

A first arm driving part ADP1 may be disposed on the back surface BS of the display module DM, and this configuration will be described in FIG. 12 below.

Figure 12:
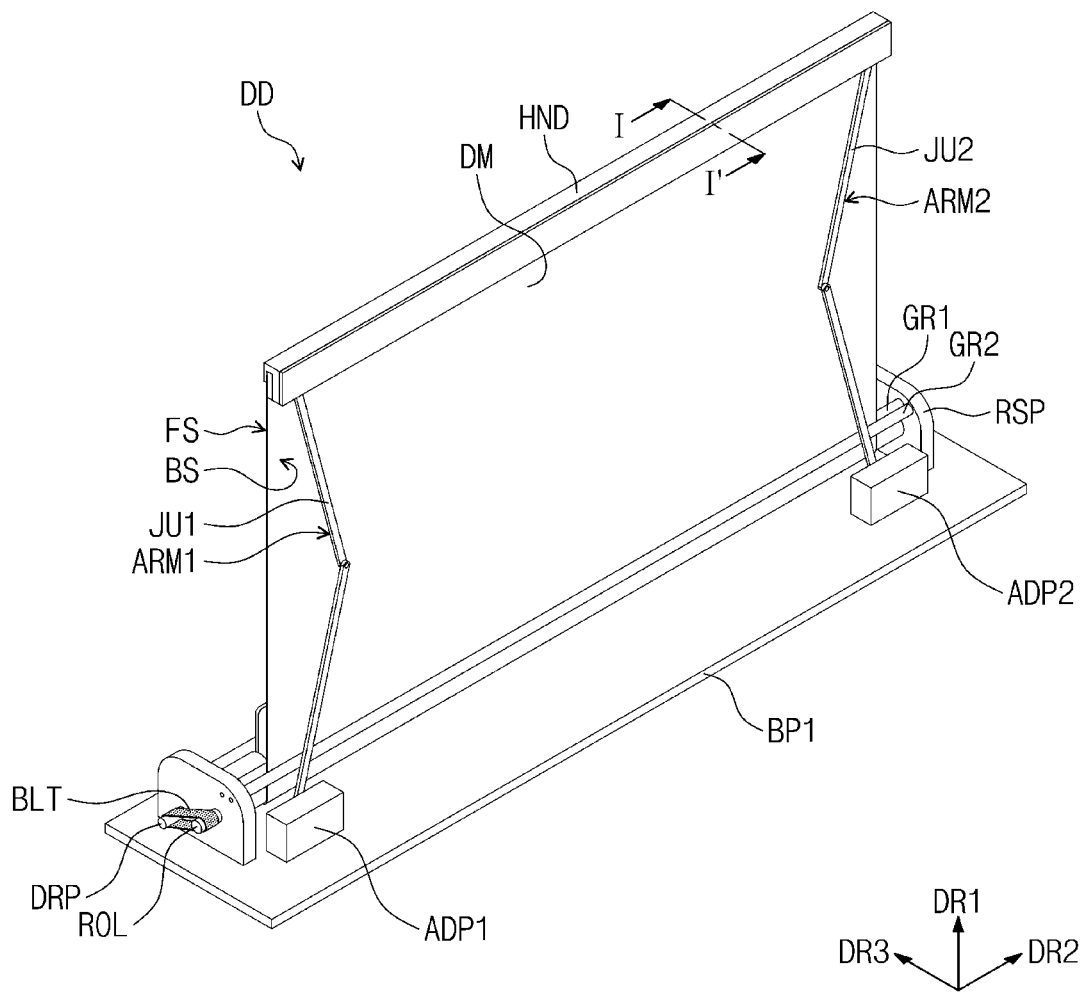
FIG. 12 illustrates the inside of housing of the display device illustrated in FIG. 5.

FIG. 12 illustrates the inside of the housing of the display device illustrated in FIG. 5.

Referring to FIG. 12, the display device DD may include first and second arm driving parts ADP1 and ADP2. The first and second arm driving parts ADP1 and ADP2 may be disposed on the bottom portion BP in the housing HS.

The first and second arm driving parts ADP1 and ADP2 may be disposed behind the back surface BS of the display module DM. In the present specification, the expression "behind the back surface BS" may connote "below the back surface BS" when the front surface FS of the display module DM faces upward based on the third direction DR3. The first and second arm driving parts ADP1 and ADP2 may be spaced apart from each other in the second direction DR2.

One end of the first arm ARM1 may be connected to the handle HND, and the other end of the first arm ARM1 may be connected to the first arm driving part ADP1. One end of the second arm ARM2 may be connected to the handle HND, and the other end of the second arm ARM2 may be connected to the second arm driving part ADP2.

The first and second arms ARM1 and ARM2 may expand or contract between the first and second arm driving parts ADP1 and ADP2 and the handle HND. For example, the first and second arm driving parts ADP1 and ADP2 may drive the first arm ARM1 and the second arm ARM2 so that the first arm ARM1 and the second arm ARM2 may expand or contract in the first direction DR1.

The first arm driving part ADP1 connected to the first joint unit JU1 may move the first joint unit JU1 clockwise or counterclockwise around the first arm driving part ADP1 so that the first arm ARM1 may expand or contract in the first direction DR1.

The second arm driving unit ADP2 connected to the second joint unit JU2 moves the second joint unit JU2 counterclockwise or clockwise around the second arm driving unit ADP2 so that the second arm ARM2 may contract or expand in the first direction DR1.

When the display module DM is wound around the roller ROL, the first and second arms ARM1 and ARM2 may contract in the first direction DR1. When the display module DM is unwound from the roller ROL, the first and second arms ARM1 and ARM2 may expand in the first direction DR1.

Figure 13:
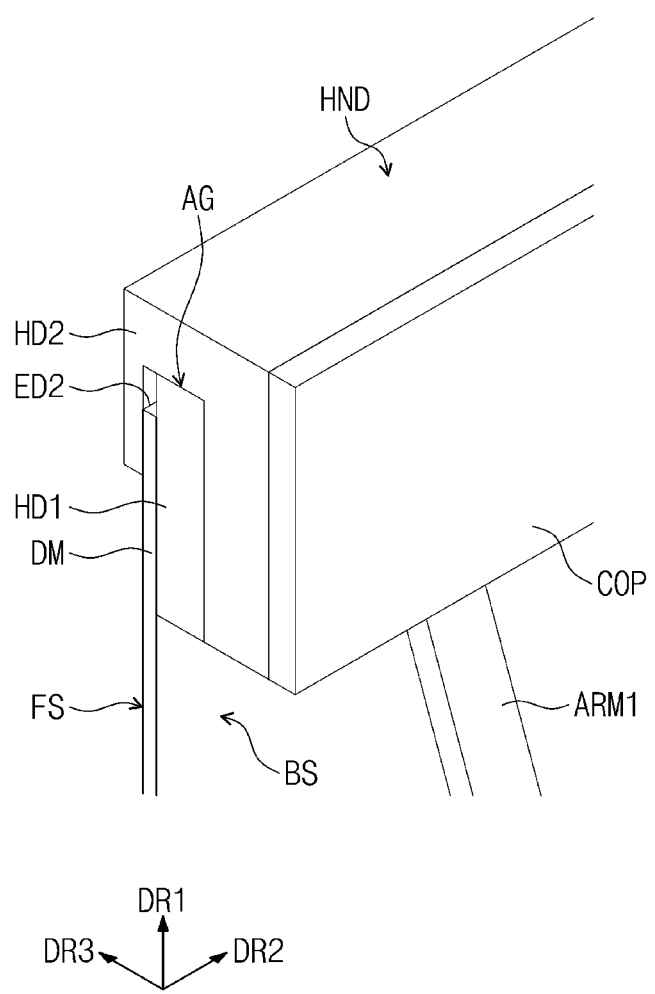
FIG. 13 is an enlarged view of a side of the handle illustrated in FIG. 12.

FIG. 13 is an enlarged view of a side of the handle illustrated in FIG. 12.

Referring to FIG. 13, the handle HND may include a first holder HD1, a second holder HD2, and a cover part COP. The first holder HD1 may be adjacent to the other end ED2 of the display module DM and disposed on the back surface BS of the display module DM. The first holder HD1 may be in contact with the back surface BS.

The other end ED2 of the display module DM and the first holder HD1 may be coupled to the second holder HD2. For example, an accommodating groove AG facing a lower direction based on the first direction DR1 may be defined in the second holder HD2. The accommodating groove AG may extend in the second direction DR2. The other end ED2 of the display module DM and the first holder HD1 may be inserted into the accommodating groove AG and coupled to the second holder HD2.

The cover part COP may be disposed on the back surface BS of the display module DM. The cover part COP may be disposed on one of both surfaces of the second holder HD2 opposite to each other in the third direction DR3. One surface of the second holder HD2 on which the cover part COP is disposed may be disposed on the back surface BS of the display module DM.

One end of the first arm ARM1 may be inserted and disposed in a space between the second holder HD2 and the cover part COP. This structure will be described in detail below. One end of the second arm ARM2 may also be disposed in a space between the second holder HD2 and the cover part COP.

Figure 14:
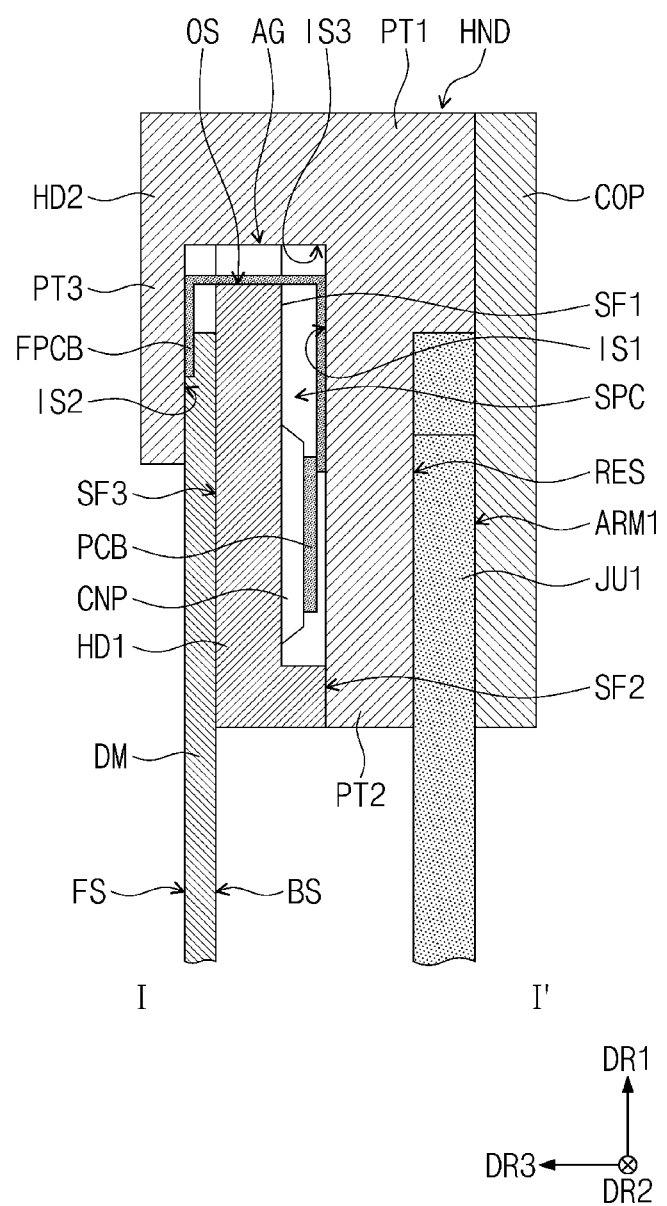
FIG. 14 is a cross-sectional view taken along line I-I' illustrated in FIG. 12.
Figure 15:
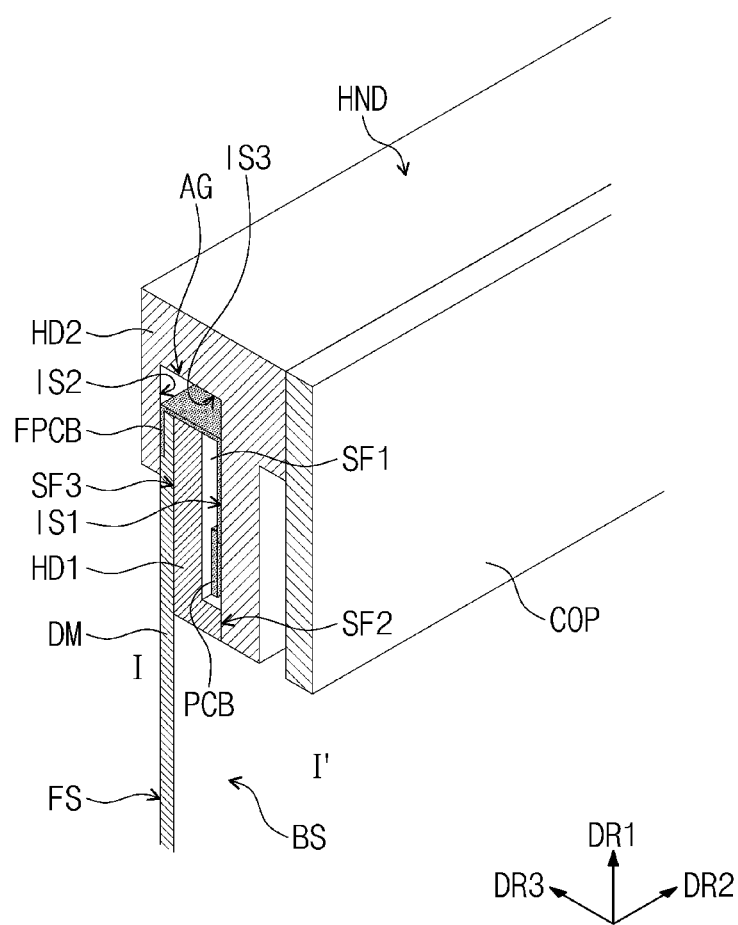
FIG. 15 is a perspective view of the cross section illustrated in FIG. 14.

FIG. 14 is a cross-sectional view taken along line I-I' illustrated in FIG. 12. FIG. 15 is a perspective view of the cross section illustrated in FIG. 14.

Referring to FIGS. 14 and 15, a flexible circuit board FPCB may be connected to the other end ED2 of the display module DM. A printed circuit board PCB may be disposed on the back surface BS of the display module DM. The printed circuit board PCB may be disposed to face the back surface BS of the display module DM and connected to the flexible circuit board FPCB. The first holder HD1 may be disposed between the printed circuit board PCB and the display module DM.

The handle HND may further include a connection part CNP disposed on one surface of the first holder HD1. The connection part CNP may protrude from the first holder HD1 toward the printed circuit board PCB. The printed circuit board PCB may be disposed on and connected to the connection part CNP.

The other end ED2 of the display module DM, the flexible circuit board FPCB, the printed circuit board PCB, the first holder HD1, and the connection part CNP may be accommodated in the second holder HD2. For example, the other end ED2 of the display module DM, the flexible circuit board FPCB, the printed circuit board PCB, the first holder HD1, and the connection part CNP may be inserted into the accommodating groove AG so as to be coupled to the second holder HD2.

Since the printed circuit board PCB is connected to the connection part CNP protruding from the first holder HD1, the printed circuit board PCB may be spaced apart from the first holder HD1. Accordingly, the printed circuit board PCB may not be in contact with the first holder HD1.

The first holder HD1 may include a first surface SF1, a second surface SF2, and a third surface SF3. The first surface SF1 and the third surface SF3 may be surfaces opposite to each other in the third direction DR3. The second surface SF2 and the third surface SF3 may be surfaces opposite to each other in the third direction DR3. That is, the third surface SF3 may be defined as a surface of the first holder HD1 opposite to the first and second surfaces SF1 and SF2. The third surface SF3 may face the back surface BS of the display module DM.

The printed circuit board PCB may face the first surface SF1 and be spaced apart therefrom. The connection part CNP may protrude from the first surface SF1 toward the printed circuit board PCB.

The second surface SF2 may be disposed around the first surface SF1 and higher than the first surface SF1. For example, based on the third direction DR3, the second surface SF2 may be spaced further apart from the back surface BS of the display module DM than the first surface SF1. That is, the first surface SF1 and the second surface SF2 may be formed so as to be stepped. According to this structure, the cross section of the first holder HD1 in FIG. 14 may have an "L" shape when viewed from the second direction DR2.

The flexible circuit board FPCB connected to the other end ED2 of the display module DM may be bent and extend onto one side surface OS of the first holder HD1. The one side surface OS of the first holder HD1 may be defined as an upper end of the first holder HD1 on the basis of the first direction DR1. The one side surface OS of the first holder HD1 may be adjacent to the other end ED2 of the display module DM.

The flexible circuit board FPCB extending onto the one side surface OS of the first holder HD1 may be bent and extend onto the first surface SF1 of the first holder HD1. The flexible circuit board FPCB may extend onto the connection part CNP and be disposed on the printed circuit board PCB. The flexible circuit board FPCB may be disposed on and connected to the printed circuit board PCB.

The inner surface of the second holder HD2 defining the accommodating groove AG may include a first inner surface IS1, a second inner surface IS2, and a third inner surface IS3. The first inner surface IS1 may face the first and second surfaces SF1 and SF2. The second inner surface IS2 may face the first inner surface IS1. In addition, the second inner surface IS2 may face the third surface SF3. The first and second inner surfaces IS1 and IS2 may extend in the first direction DR1 and be spaced apart from each other in the third direction DR3.

The third inner surface IS3 may face one side surface OS of the first holder HD1. The third inner surface IS3 may extend from the upper end of the first inner surface IS1 to the upper end of the second inner surface IS2 on the basis of the first direction DR1. The third inner surface IS3 may extend in the third direction DR3.

An accommodating space SPC for disposing the printed circuit board PCB and the flexible circuit board FPCB may be defined between the first holder HD1 and the second holder HD2. For example, the printed circuit board PCB and a portion of the flexible circuit board FPCB disposed on the first surface SF1 may be disposed in the space SPC between the first surface SF1 and the first inner surface IS1. The second surface SF2 may be in contact with a portion of the first inner surface IS1 facing the second surface SF2.

The other end ED2 of the display module DM may be disposed between the second inner surface IS2 and the third surface SF3 of the first holder HD1. Accordingly, the other end ED2 of the display module DM may be disposed and fixed between the first holder HD1 and the second holder HD2.

The second holder HD2 may include a first portion PT1, a second portion PT2, and a third portion PT3. The first portion PT1 may be disposed above the other end ED2 of the display module DM on the basis of the first direction DR1.

The second portion PT2 may extend from the first portion PT1 in the first direction DR1 and have a first inner surface IS1. That is, the second portion PT2 may extend downward on the basis of the first direction DR1.

The third portion PT3 may extend from the first portion PT1 in the first direction DR1 and may have a second inner surface IS2. That is, the third portion PT3 may extend downward on the basis of the first direction DR1. The third portion PT3 may be spaced apart from the second portion PT2 in the third direction DR3.

On the basis of the first direction DR1, the third portion PT3 may have a length smaller than that of the second portion PT2. Since the front surface FS of the display module DM is a display surface DS that displays an image, the size of the third portion PT3 may be adjusted so that the third portion PT3 covering the display surface DS may be minimized.

Since the back surface BS of the display module DM does not display an image, the size of the second portion PT2 disposed on the back surface BS of the display module DM may not be particularly limited. Accordingly, in an embodiment, the third portion PT3 may be smaller than the second portion PT2.

One end of the first arm ARM1 may be connected to the second holder HD2. For example, one end of the first arm ARM1 may be disposed in a recessed portion RES defined on one surface of the second holder HD2 disposed on the back surface BS of the display module DM. A cover part COP may be disposed on one surface of the second holder HD2 to cover one end of the first arm ARM1. The cover part COP may cover the recessed portion RES.

Since one end of the second arm ARM2 is disposed in the recessed portion RES and the cover part COP covers the one end of the second arm ARM2, the one end of the second arm ARM2 may also be connected to the second holder HD2.

Figure 16:
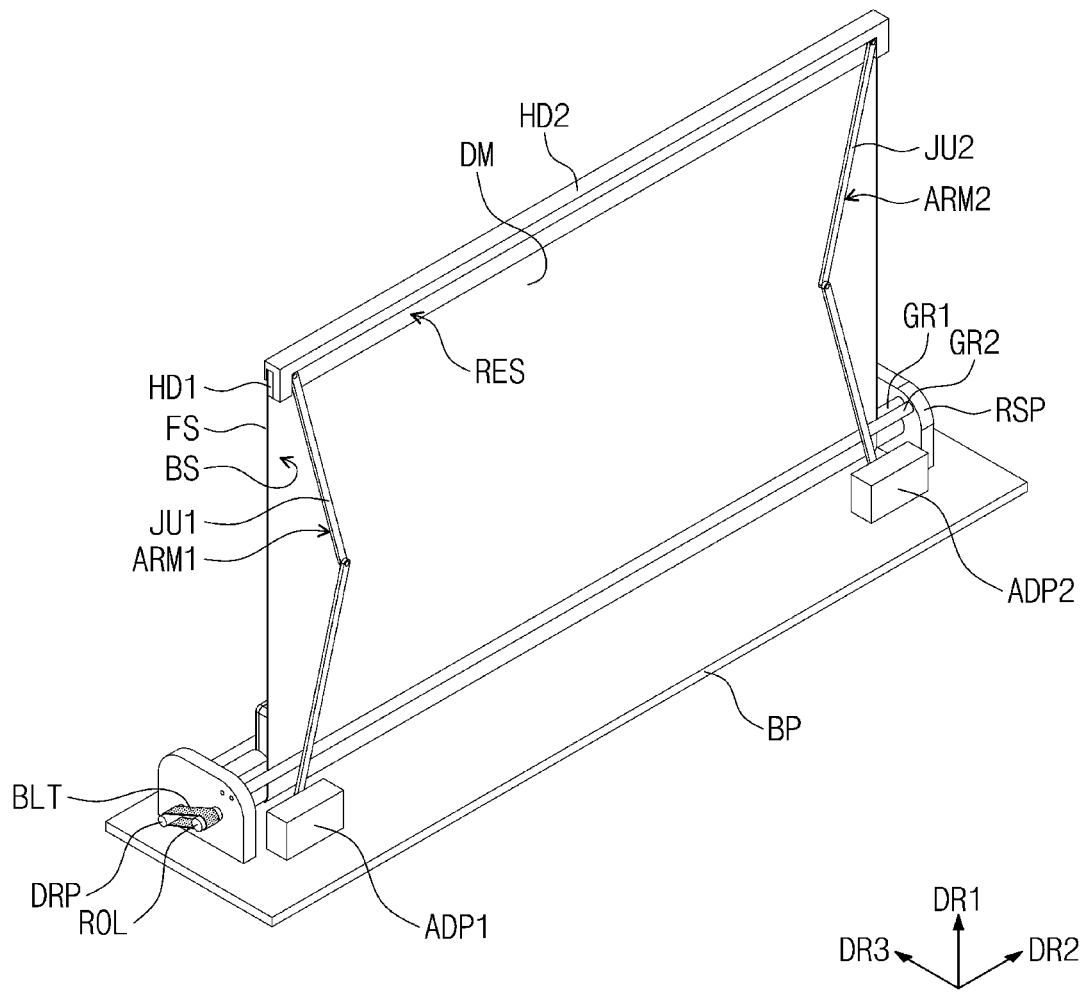
FIG. 16 illustrates the display device in a state in which the cover part is removed from FIG. 12.
Figure 17:
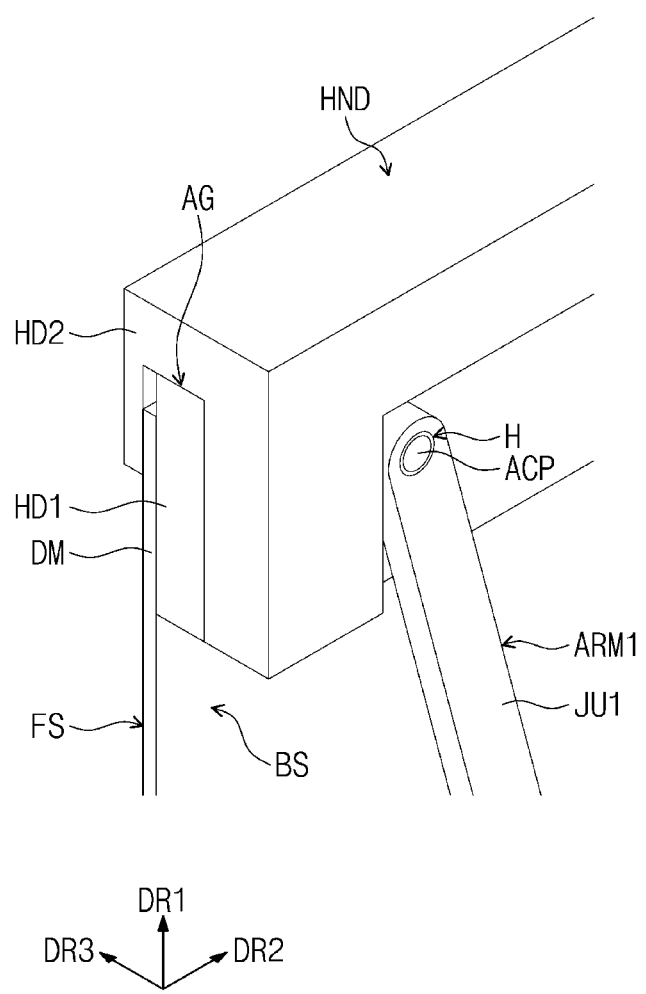
FIG. 17 is an enlarged view of a portion of the second holder in which one end of the first arm illustrated in FIG. 16 is disposed.

FIG. 16 illustrates the display device in a state in which the cover part is removed from FIG. 12. FIG. 17 is an enlarged view of a portion of the second holder in which one end of the first arm illustrated in FIG. 16 is disposed.

Referring to FIGS. 16 and 17, the second holder HD2 may extend in the second direction DR2. The recessed portion RES defined on one surface of the second holder HD2 may extend in the second direction DR2. On the basis of the first direction DR1, the recessed portion RES may extend to the lower end of the second holder HD2. That is, the recessed portion RES may be defined from the lower end of the second holder HD2.

An arm connection part ACP may be disposed on one surface of the second holder HD2 on which the recessed portion RES is defined. The arm connection part ACP may protrude from one surface of the second holder HD2. The arm connection part ACP may have a circular shape when viewed from the third direction DR3.

In a portion of the first arm ARM1 adjacent to one end of the first arm ARM1, a hole H having a circular shape may be defined, when viewed from the third direction DR3. The hole H may penetrate a portion of the first arm ARM1 in the third direction DR3.

As the arm connection part ACP is inserted into the hole H, one end of the first arm ARM1 may be coupled to the second holder HD2. As the arm connection part ACP having a circular shape is inserted into the hole H having a circular shape, one end of the first arm ARM1 may be coupled to the second holder HD2 so that the first arm ARM1 may rotate.

One end of the second arm ARM2 may also be inserted into an arm connection part ACP and coupled to the second holder HD2 so that the second arm ARM2 may rotate.

Figure 18:
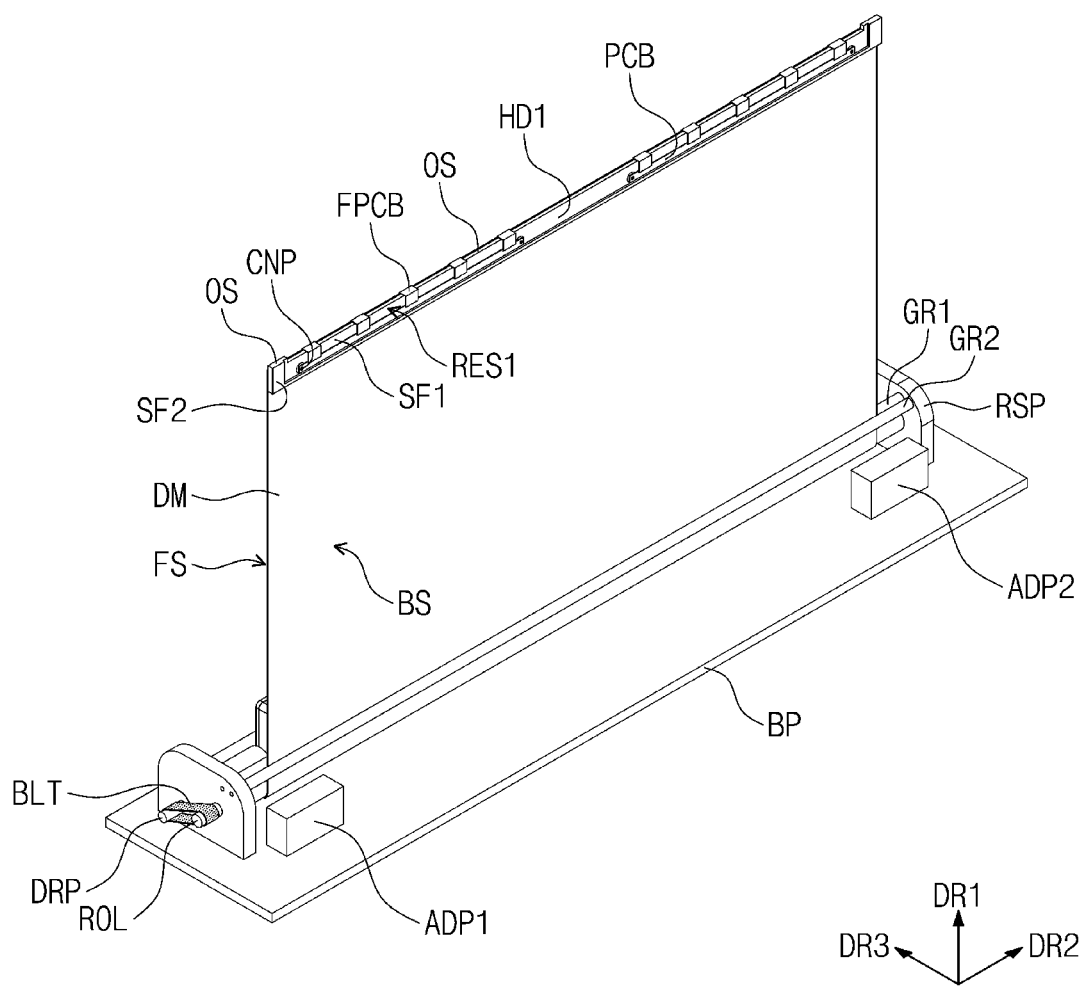
FIG. 18 illustrates the display device in a state in which the first and second arms and the second holder are removed from FIG. 16.
Figure 19:
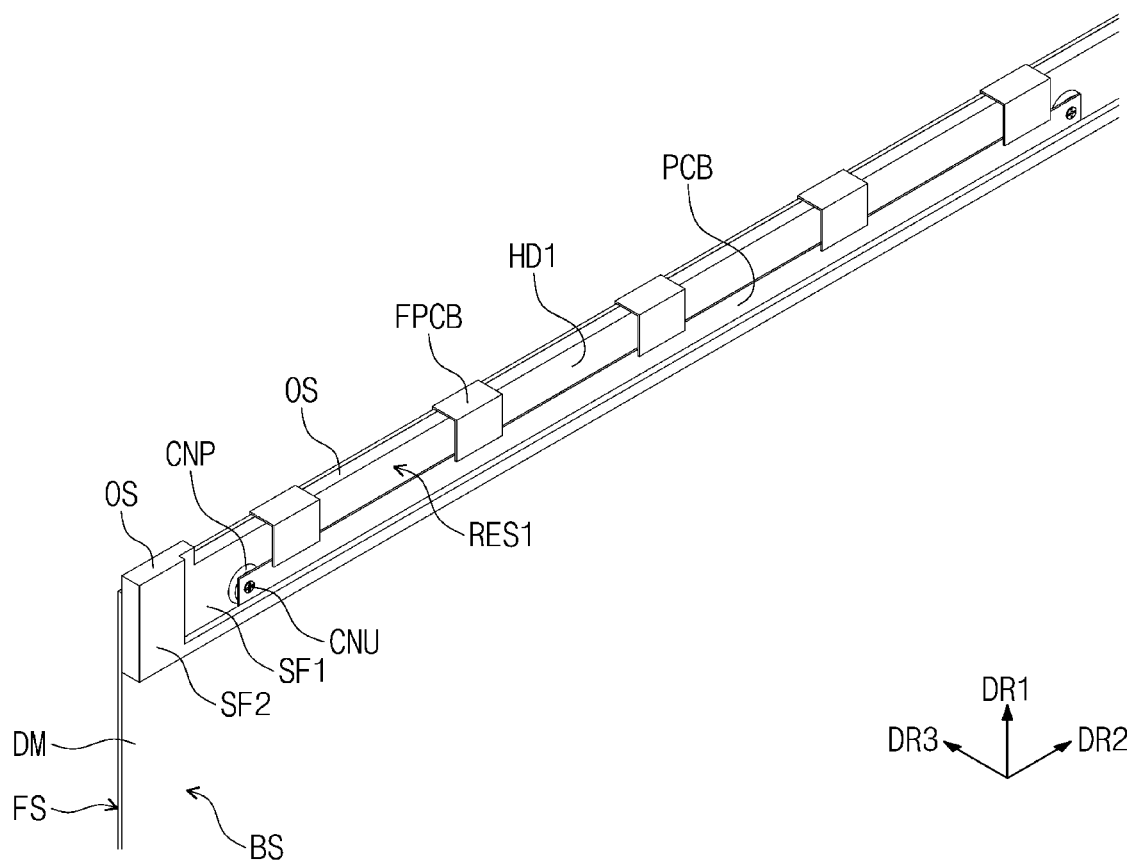
FIG. 19 is an enlarged view of a portion of the first holder on which any one printed circuit board illustrated in FIG. 18 is disposed.

FIG. 18 illustrates the display device in a state in which the first and second arms and the second holder are removed from the display device as illustrated in FIG. 16. FIG. 19 is an enlarged view of a portion of the first holder on which any one printed circuit board illustrated in FIG. 18 is disposed.

As an example, FIG. 19 illustrates a printed circuit board PCB disposed on the left side among the printed circuit boards PCB illustrated in FIG. 18.

Referring to FIGS. 18 and 19, the first holder HD1 may extend in the second direction DR2. The first surface SF1 may extend in the second direction DR2. Since the first surface SF1 is formed lower than the second surface SF2, a portion in which the first surface SF1 is formed may be defined as a recessed portion RES1. The recessed portion RES1 may extend in the second direction DR2.

The first surface SF1 may extend to one side surface OS of the first holder HD1. That is, the recessed portion RES1 may be formed from one side surface OS. The second surface SF2 may surround the first surface SF1 with other side surfaces excluding the one side surface OS.

The printed circuit boards PCB may be disposed on the first surface SF1. The printed circuit boards PCB may extend in the second direction DR2 and be disposed to be spaced apart from each other in the second direction DR2. One sides of the flexible circuit boards FPCB may be disposed on and connected to the printed circuit boards PCB.

A plurality of connection parts CNP may protrude from the first surface SF1. The connection parts CNP may be integrally formed with the first holder HD1, but without being limited thereto, may be manufactured separately from and connected to the first holder HD1.

The connection parts CNP may be disposed adjacent to both sides of each of the printed circuit boards PCB opposite to each other in the second direction DR2. The connection parts CNP may be disposed beneath both sides of the printed circuit boards PCB, and both sides of the printed circuit boards PCB may be connected to the connection parts CNP.

As described above, since the printed circuit boards PCB are disposed on the connection parts CNP, the printed circuit boards PCB may be spaced apart from the first surface SF1 and may not be in contact with the first surface SF1. When the printed circuit boards PCB come in contact with the first surface SF1, the lower surfaces of the printed circuit boards PCB facing the first surface SF1 may be damaged. In an embodiment, however, since the printed circuit boards PCB do not come in contact with the first surface SF1, the lower surfaces of the printed circuit boards PCB may not be damaged.

A groove GV may be defined on one side surface OS of the first holder HD1. A portion of the one side surface OS may be recessed downward to define the groove GV. The flexible circuit boards FPCB extending from the display module DM may be bent and disposed in the groove GV. The flexible circuit boards FPCB may be bent past the groove GV and extend to the first surface SF1. Since the flexible circuit boards FPCB are disposed in the groove GV, the flexible circuit boards FPCB may not protrude higher than the one side surface OS on which the groove GV is not formed.

Figure 20:
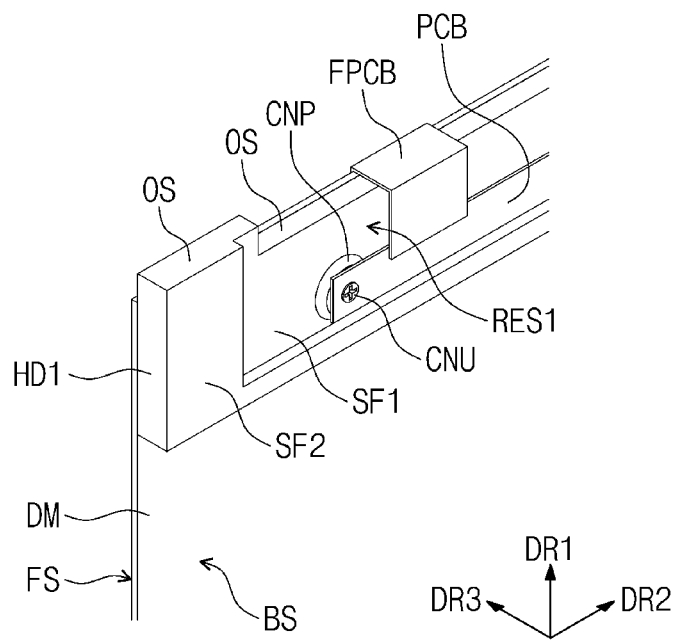
FIG. 20 is an enlarged view of a connection part disposed on the left among the connection parts illustrated in FIG. 19.
Figure 21:
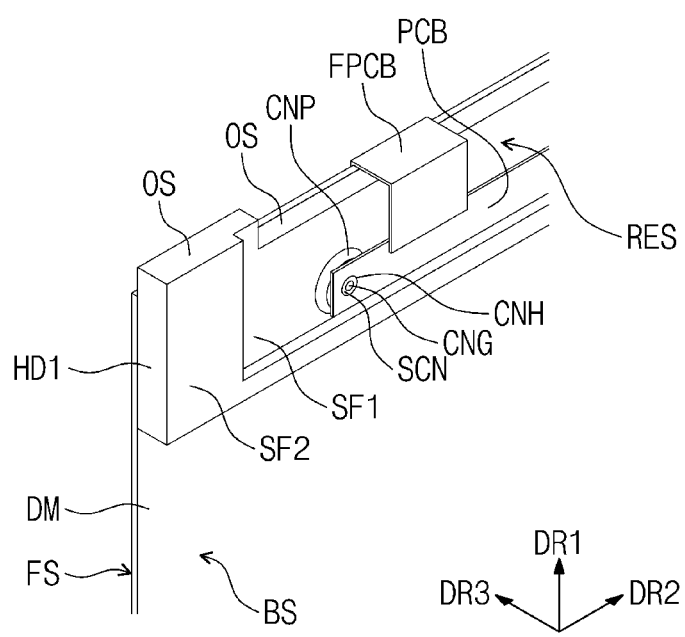
FIG. 21 illustrates a connection part in a state in which a fastening unit is removed from FIG. 20.
Figure 22:
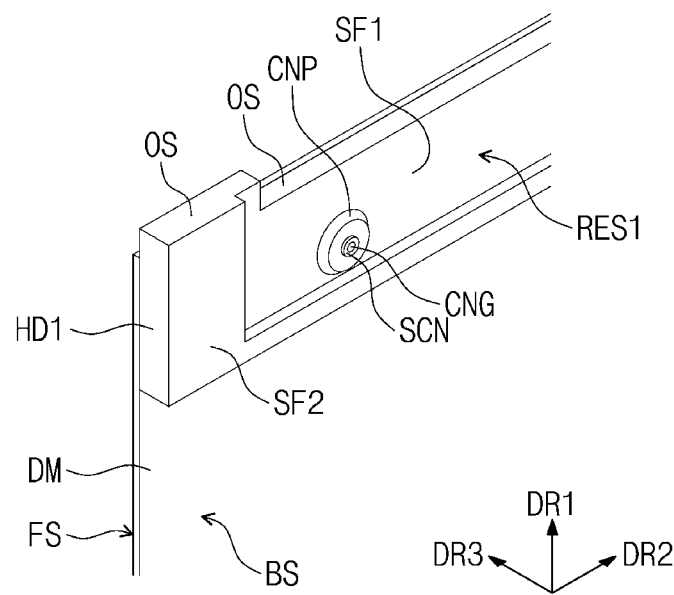
FIG. 22 illustrates a connection part in a state in which the printed circuit board and the flexible circuit board are removed from FIG. 21.

FIG. 20 is an enlarged view of a connection part disposed on the left among the connection parts illustrated in FIG. 19. FIG. 21 illustrates a connection part in a state in which a fastening unit is removed from FIG. 20. FIG. 22 illustrates a connection part in a state in which the printed circuit board and the flexible circuit board are removed from FIG. 21.

Referring to FIGS. 20, 21, and 22, a sub-connection part SCN may protrude from the connection part CNP. The sub-connection part SCN may protrude from the center of the connection part CNP when viewed from the third direction DR3.

The connection part CNP may have a circular shape when viewed from the third direction DR3, but without being limited thereto, may have various shapes such as an oval or a polygon. The sub-connection part SCN may have a circular shape when viewed from the third direction DR3, but without being limited thereto, may have various shapes such as an oval or a polygon. A connection groove CNG may be defined in the sub-connection part SCN.

The printed circuit board PCB may be connected to the connection part CNP by the fastening unit CNU. For example, a connection hole CNH may be defined in a portion of the printed circuit board PCB adjacent to one side thereof. The sub-connection part SCN may be inserted into the connection hole CNH. The fastening unit CNU is inserted into the connection groove CNG through the connection hole CNH so that the printed circuit board PCB may be connected to the connection part CNP. As an example, the fastening unit CNU may be a screw.

According to the above-described structure, the printed circuit board PCB and the flexible circuit board FPCB may be coupled to the first and second holders HD1 and HD2.

The printed circuit board PCB may be disposed in the roller ROL and the flexible circuit board FPCB may be connected to the printed circuit board PCB in the roller ROL and extend to the outside of the roller ROL to be connected to the display module DM. In this case, when the roller ROL rotates, the flexible circuit board FPCB having a smaller thickness may be damaged while being wound around the roller ROL. In addition, the flexible circuit board FPCB may be separated from the printed circuit board PCB due to the stress generated in the flexible circuit board FPCB bent while being wound around the roller ROL.

In an embodiment, however, the printed circuit board PCB and the flexible circuit board FPCB may be accommodated in the second holder HD2 of the handle HND disposed on the upper end of the display module DM. Accordingly, damage to the flexible circuit board FPCB may be prevented, and a phenomenon in which the flexible circuit board FPCB and the printed circuit board PCB are separated from each other may be prevented. In addition, since the printed circuit board PCB and the flexible circuit board FPCB are not disposed in the roller ROL, the size of the roller ROL may be reduced.

Figure 23:
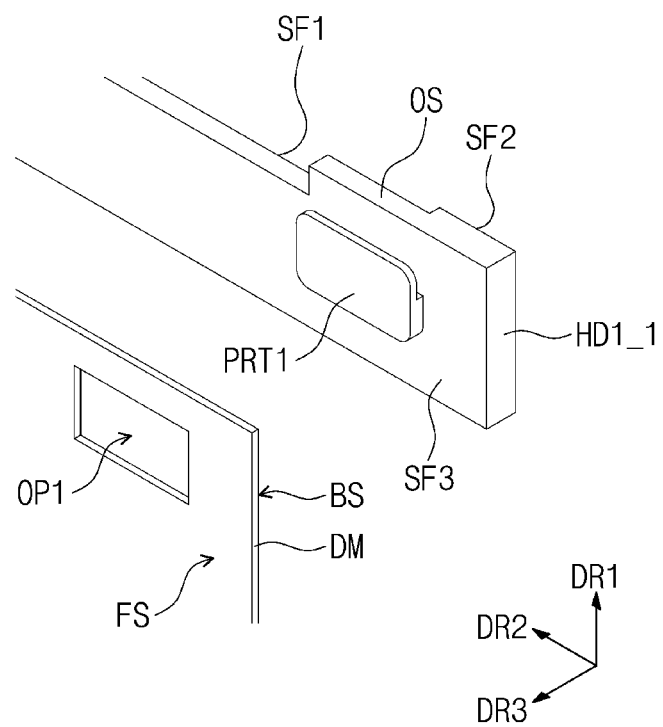
FIG. 23 illustrates a configuration of a first holder according to another embodiment.
Figure 24:
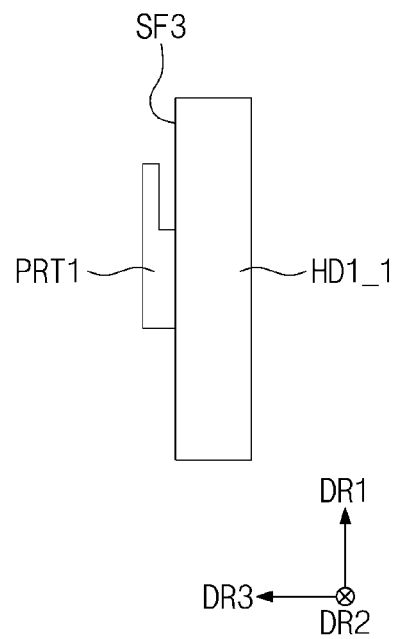
FIG. 24 illustrates a side surface of the first holder illustrated in FIG. 23.

FIG. 23 illustrates a configuration of a first holder according to another embodiment. FIG. 24 illustrates a side surface of the first holder illustrated in FIG. 23.

As an example, FIG. 23 illustrates a portion of a first holder HD1_1, and FIG. 24 illustrates a side surface of the first holder HD1_1 viewed from the second direction DR2.

Referring to FIGS. 23 and 24, a first protruding portion PRT1 may protrude from the first holder HD1_1 toward the display module DM. The first protruding portion PRT1 may protrude from the third surface SF3 of the first holder HD1_1. When viewed from the second direction DR2, the first protruding portion PRT1 may have an "L"-shaped ring structure.

A first opening OP1 corresponding to the first protruding portion PRT1 may be defined in the display module DM. When viewed from the third direction DR3, the first protruding portion PRT1 may overlap the first opening OP1.

Figure 25:
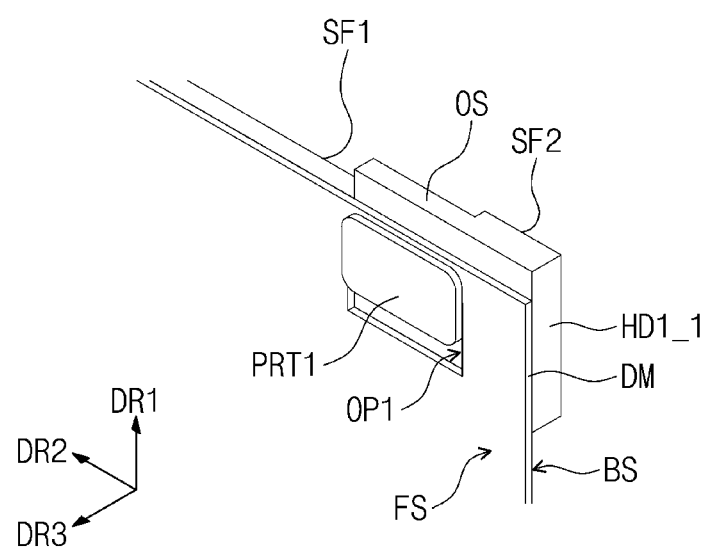
FIG. 25 illustrates a display module coupled to the first holder illustrated in FIG. 24.
Figure 26:
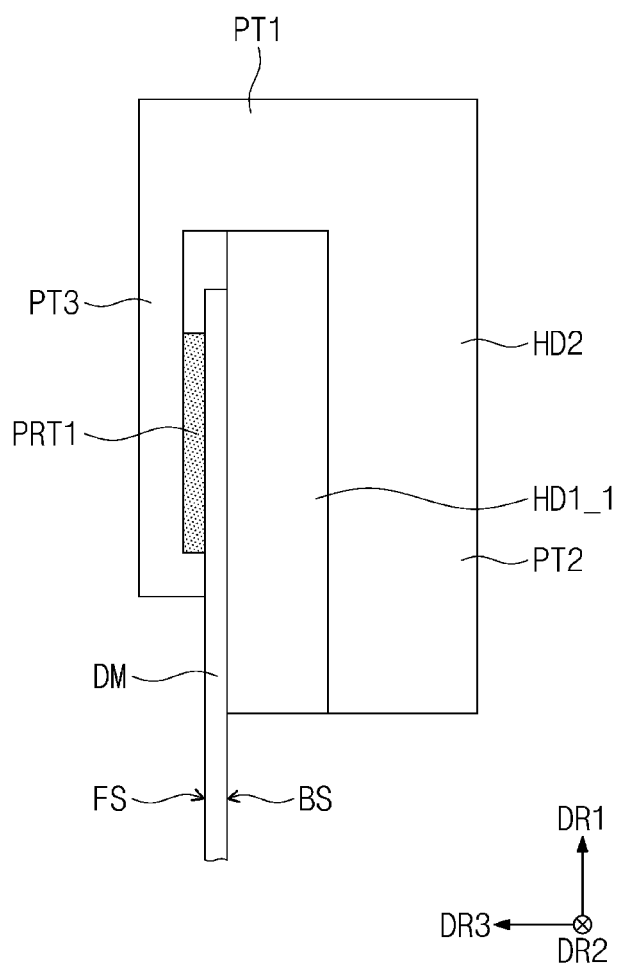
FIG. 26 is a side view of the first holder and the display module coupled to each other as shown in FIG. 25.

FIG. 25 illustrates a display module coupled to the first holder illustrated in FIG. 24. FIG. 26 is a side view of the first holder and the display module coupled to each other as shown in FIG. 25.

As an example, FIG. 26 illustrates the second holder HD2 together with the first holder HD1_1 and the display module DM.

Referring to FIGS. 25 and 26, the first protruding portion PRT1 may pass through the first opening OP1. The display module DM may be fixed to the first holder HD1_1 by being caught by the first protruding portion PRT1 having a ring shape. The display module DM may be much easily coupled to the first holder HD1_1 by the first protruding portion PRT1.

As an example, when viewed from the third direction DR3, the first protruding portion PRT1 may have a rectangular shape, but without being limited thereto, may have various shapes such as a polygon, a circle, or an oval.

The second holder HD2 may cover the first protruding portion PRT1. The third portion PT3 of the second holder HD2 may cover the first protruding portion PRT1. Accordingly, the first protruding portion PRT1 may not be visually recognized from the outside due to the second holder HD2.

Figure 27:
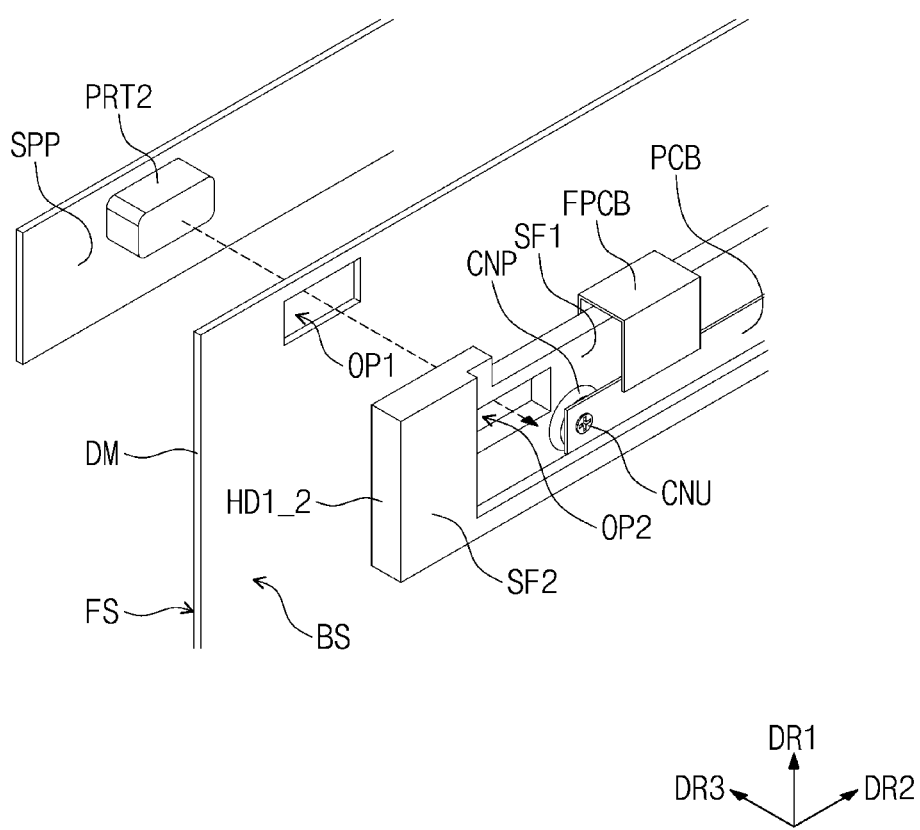
FIG. 27 illustrates a configuration of a support plate to be coupled to a first holder according to another embodiment.
Figure 28:
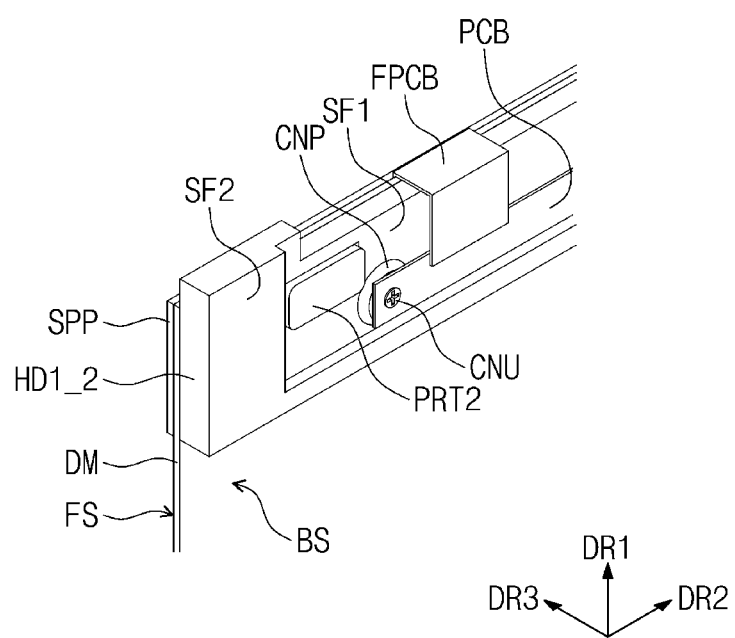
FIG. 28 illustrates the first holder and the display module coupled to the support plate illustrated in FIG. 27.
Figure 29:
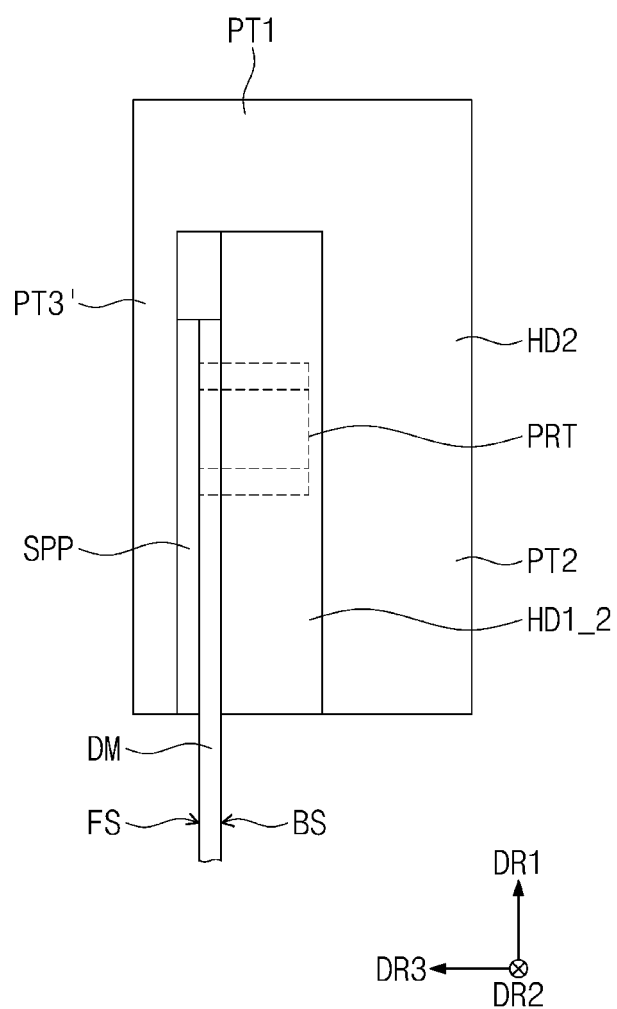
FIG. 29 is a side view of the support plate, the first holder, and the display module coupled to each other as shown in FIG. 28.

FIG. 27 illustrates a configuration of a support plate to be coupled to a first holder according to another embodiment. FIG. 28 illustrates the first holder and the display module coupled to the support plate illustrated in FIG. 27. FIG. 29 is a side view of the support plate, the first holder, and the display module coupled to each other as shown in FIG. 28.

As an example, FIG. 29 illustrates the second holder HD2 together with the support plate SPP, the first holder HD1_2, and the display module DM.

Referring to FIGS. 27, 28, and 29, the support plate SPP may be disposed on the front surface FS of the display module DM. A second protruding portion PRT2 may protrude from the support plate SPP toward the display module DM.

The second protruding portion PRT2 may pass through a first opening OP1 defined in the display module DM and a second opening OP2 defined in the first holder HD1_2. As an example, the second protruding portion PRT2 is illustrated with a dotted line in FIG. 29. The second opening OP2 may be defined in the first surface SF1 of the first holder HD1_2.

The display module DM and the first holder HD1_2 may be easily coupled to each other by the second protruding portion PRT2. As an example, the second protruding portion PRT2 may have a rectangular shape when viewed from the third direction DR3, but without being limited thereto, may have various shapes such as a polygon, a circle, or an oval.

The second holder HD2 may cover the support plate SPP and the second protruding portion PRT2. The third portion PT3' of the second holder HD2 may cover the support plate SPP, and the second portion PT2 of the second holder HD2 may cover the second protruding portion PRT2. Accordingly, the support plate SPP and the second protruding portion PRT2 may not be visually recognized from the outside due to the second holder HD2.

Figure 30:
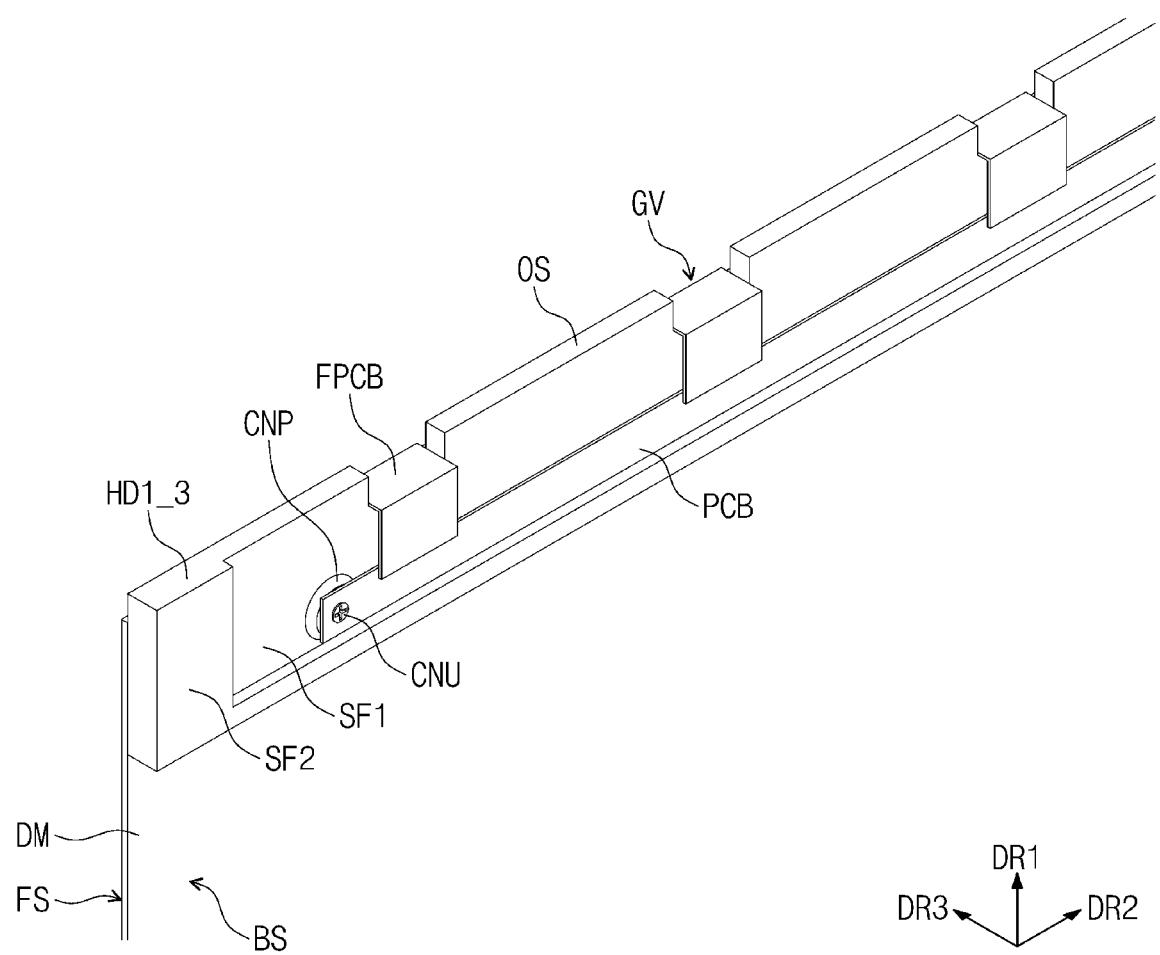
FIG. 30 illustrates a configuration of a first holder according to another embodiment.

FIG. 30 illustrates a configuration of a first holder according to another embodiment.

As an example, FIG. 30 is a perspective view corresponding to FIG. 19.

Referring to FIG. 30, grooves GV' may be respectively defined in a plurality of portions of one side surface OS of a first holder HD1_3. The grooves GV' may be disposed to correspond respectively to the flexible circuit boards FPCB. The flexible circuit boards FPCB may be respectively disposed in the grooves GV'. Since the grooves GV' are formed to correspond respectively to the flexible circuit boards FPCB, the flexible circuit boards FPCB may be more easily aligned and disposed.

According to the embodiments, the flexible circuit board and the printed circuit board may not be disposed in the roller, but may be connected to the upper end of the display module and accommodated in the handle disposed on the upper end of the display module. Since the flexible circuit board and the printed circuit board are not disposed in the roller, the roller may be downsized, and damage to the flexible circuit board and the printed circuit board due to rotation of the roller may be prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display module;
   a roller connected to a first end of the display module;
   a flexible circuit board connected to a second end of the display module opposite the first end;
   a printed circuit board facing a back surface of the display module and connected to the flexible circuit board;
   a first holder disposed between the printed circuit board and the display module;
   a second holder in which an accommodating groove to accommodate the printed circuit board and the flexible circuit board is defined;
   a connection part protruding from the first holder toward the printed circuit board and connected to the printed circuit board; and an arm disposed on the back surface of the display module and connected to the second holder, wherein one end of the arm is disposed in the recessed portion defined on one surface of the second holder.

2. The display device of claim 1, wherein the printed circuit board is spaced apart from the first holder.

3. The display device of claim 1, wherein the second end of the display module, the flexible circuit board, the printed circuit board, the first holder, and the connection part are inserted in the accommodating groove together.

4. The display device of claim 3, wherein the first holder comprises: a first surface facing and spaced apart from the printed circuit board; and a second surface disposed around the first surface and spaced further apart from the back surface of the display module than the first surface, wherein the connection part protrudes from the first surface.

5. The display device of claim 4, wherein:

an inner surface of the second holder defining the accommodating groove comprises a first inner surface facing the first and second surfaces and a second inner surface facing the first inner surface; and the printed circuit board and a portion of the flexible circuit board disposed on the first surface are disposed in a space between the first surface and the first inner surface.

6. The display device of claim 5, wherein the second end of the display module is disposed between the second inner surface and the first holder.

7. The display device of claim 5, wherein the second holder comprises:

a first portion disposed on the second end of the display module;

a second portion extending from the first portion and having the first inner surface; and a third portion extending from the first portion and having the second inner surface, wherein the third portion has a length smaller than that of the second portion in a first direction from the first end of the display module toward the second end thereof.

8. The display device of claim 1, wherein the flexible circuit board is bent and extends on one side surface of the first holder adjacent to the second end of the display module and on the first surface so as to be connected to the printed circuit board.

9. The display device of claim 8, wherein the flexible circuit board is disposed in a groove defined by a recessed portion of the one side surface of the first holder.

10. The display device of claim 1, wherein the arm is configured to expand or contract.

11. The display device of claim 10, wherein the arm comprises a plurality of joint units coupled to each other.

12. The display device of claim 10, further comprising a cover part disposed on the one surface of the second holder so as to cover the one end of the arm.

13. The display device of claim 1, wherein:
the flexible circuit board is provided in plurality; and
the plurality of flexible circuit boards are respectively disposed in a plurality of grooves defined on one side surface of the first holder adjacent to the second end of the display module.

14. A display device comprising:
a display module;
a roller connected to a first end of the display module;
a flexible circuit board connected to a second end of the display module opposite the first end;
a printed circuit board facing a back surface of the display module and connected to the flexible circuit board;
a first holder disposed between the printed circuit board and the display module;
a second holder configured to accommodate the printed circuit board and the flexible circuit board; and
a connection part protruding from the first holder toward the printed circuit board and connected to the printed circuit board, wherein the first holder comprises:
a first surface facing and spaced apart from the printed circuit board; and
a second surface disposed around the first surface and spaced further apart from the back surface of the display module than the first surface,
wherein the connection part protrudes from the first surface,
wherein an accommodating groove into which the second end of the display module, the flexible circuit board, the printed circuit board, the first holder, and the connection part are inserted, is defined in the second holder,
wherein an inner surface of the second holder defining the accommodating groove comprises a first inner surface facing the first and second surfaces and a second inner surface facing the first inner surface,
wherein the printed circuit board and a portion of the flexible circuit board disposed on the first surface are disposed in a space between the first surface and the first inner surface, and
wherein the second surface is in contact with a portion of the first inner surface facing the second surface.

15. A display device comprising:
a display module;
a roller connected to a first end of the display module;
a flexible circuit board connected to a second end of the display module opposite the first end;
a printed circuit board facing a back surface of the display module and connected to the flexible circuit board;
a first holder disposed between the printed circuit board and the display module;
a second holder configured to accommodate the printed circuit board and the flexible circuit board;
a connection part protruding from the first holder toward the printed circuit board and connected to the printed circuit board; and
a first protruding portion that protrudes from the first holder toward the display module,
wherein the first protruding portion passes through a first opening defined in the display module.

16. The display device of claim 15, wherein the second holder covers the first protruding portion.

17. A display device comprising:
a display module;
a roller connected to a first end of the display module;
a flexible circuit board connected to a second end of the display module opposite the first end;
a printed circuit board facing a back surface of the display module and connected to the flexible circuit board;
a first holder disposed between the printed circuit board and the display module;
a second holder configured to accommodate the printed circuit board and the flexible circuit board;
a connection part protruding from the first holder toward the printed circuit board and connected to the printed circuit board;
a support plate disposed on a front surface of the display module; and a second protruding portion protruding from the support plate toward the display module,
wherein the second protruding portion passes through a first opening defined in the display module and a second opening defined in the first holder.

18. The display device of claim 17, wherein the second holder covers the support plate and the second protruding portion.

19. A display device comprising:
a display module;
a roller connected to a first end of the display module;
a flexible circuit board connected to a second end of the display module opposite the first end;
a printed circuit board facing a back surface of the display module and connected to the flexible circuit board;
a first holder disposed between the printed circuit board and the display module and defining a recessed portion in which the printed circuit board is disposed; and
a second holder configured to accommodate the first holder, the printed circuit board, and the flexible circuit board,
wherein the printed circuit board is spaced apart from a first surface of the first holder defining the recessed portion.

* * * * *